United States Patent
Kim et al.

(10) Patent No.: US 12,253,883 B2
(45) Date of Patent: Mar. 18, 2025

(54) DIGITIZER INCLUDING DUMMY LINES AND FOLDABLE DISPLAY DEVICE INCLUDING THE SAME

(71) Applicant: SAMSUNG DISPLAY CO., LTD., Yongin-si (KR)

(72) Inventors: Yong-Kwan Kim, Yongin-si (KR); Hirotsugu Kishimoto, Yongin-si (KR); Hyunjae Na, Yongin-si (KR); Seokwon Jang, Yongin-si (KR); Chul Ho Jeong, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/469,320

(22) Filed: Sep. 18, 2023

(65) Prior Publication Data
US 2024/0184332 A1    Jun. 6, 2024

(30) Foreign Application Priority Data
Dec. 1, 2022   (KR) .......................... 10-2022-0165884

(51) Int. Cl.
*G06F 3/044* (2006.01)
*G06F 1/16* (2006.01)
*G06F 3/041* (2006.01)

(52) U.S. Cl.
CPC .......... *G06F 1/1641* (2013.01); *G06F 1/1616* (2013.01); *G06F 1/1643* (2013.01); *G06F 1/1652* (2013.01); *G06F 3/04164* (2019.05); *G06F 3/0446* (2019.05); *G06F 3/0448* (2019.05); *G06F 2203/04102* (2013.01)

(58) Field of Classification Search
CPC .... G06F 1/1641; G06F 1/1643; G06F 1/1652; G06F 3/041; G06F 3/0412; G06F 3/0414; G06F 3/0416; G06F 3/044; G06F 3/0446; G06F 3/045; G06F 3/046; G06F 3/047; G06F 3/048
USPC ................................................. 345/173–179
See application file for complete search history.

(56) References Cited

U.S. PATENT DOCUMENTS

| | | | | |
|---|---|---|---|---|
| 11,500,506 B2 * | 11/2022 | Kishimoto | ............ | H10K 59/12 |
| 11,543,926 B2 | 1/2023 | Kishimoto et al. | | |
| 11,893,197 B2 * | 2/2024 | Jeon | ...................... | G06F 3/0446 |
| 12,001,242 B2 * | 6/2024 | Cho | ...................... | G06F 1/1616 |
| 12,118,174 B2 * | 10/2024 | Kishimoto | ............ | G06F 3/0446 |

(Continued)

FOREIGN PATENT DOCUMENTS

| | | |
|---|---|---|
| CN | 114822239 | 7/2022 |
| CN | 114822240 | 7/2022 |

(Continued)

*Primary Examiner* — Ke Xiao
*Assistant Examiner* — Nelson Lam
(74) *Attorney, Agent, or Firm* — F. Chau & Associates, LLC

(57) ABSTRACT

A digitizer includes a first sensing coil disposed in an active region, a first dummy line disposed in the same layer as the first sensing coil, a second sensing coil disposed below the first sensing coil in the active region, a second dummy line disposed in the same layer as the second sensing coil, a bridge line disposed below the second sensing coil, and a third dummy line disposed in the same layer as the bridge line. At least two dummy lines among the first, second, and third dummy lines extend in the same direction.

22 Claims, 30 Drawing Sheets

(56) References Cited

U.S. PATENT DOCUMENTS

| | | | |
|---|---|---|---|
| 2019/0250746 A1* | 8/2019 | Han | G06F 3/04164 |
| 2020/0393925 A1 | 12/2020 | Chen et al. | |
| 2021/0357048 A1* | 11/2021 | Kishimoto | H10K 59/40 |
| 2021/0367020 A1* | 11/2021 | Bok | H10K 59/1213 |
| 2022/0086267 A1* | 3/2022 | Shin | H04M 1/0268 |
| 2022/0091632 A1* | 3/2022 | Hong | H10K 59/40 |
| 2022/0147102 A1 | 5/2022 | Kishimoto et al. | |
| 2022/0197425 A1* | 6/2022 | Kim | H01Q 1/44 |
| 2022/0221952 A1* | 7/2022 | Kishimoto | G06F 3/0412 |
| 2022/0229469 A1 | 7/2022 | Cho et al. | |
| 2022/0238821 A1 | 7/2022 | Cho et al. | |
| 2023/0040591 A1* | 2/2023 | Kishimoto | H10K 59/12 |
| 2023/0195170 A1* | 6/2023 | Shin | G06F 1/1652 |
| | | | 361/679.27 |

FOREIGN PATENT DOCUMENTS

| | | |
|---|---|---|
| KR | 10-2021-0142039 | 11/2021 |
| KR | 10-2022-0037007 | 3/2022 |
| KR | 10-2022-0039952 | 3/2022 |

\* cited by examiner

DIGITIZER INCLUDING DUMMY LINES AND FOLDABLE DISPLAY DEVICE INCLUDING THE SAME

CROSS-REFERENCE TO RELATED APPLICATIONS

This application claims priority under 35 U.S.C. § 119 to Korean Patent Application No. 10-2022-0165884, filed on Dec. 1, 2022, the disclosure of which is incorporated by reference herein in its entirety.

TECHNICAL FIELD

Embodiments of the present disclosure relate to a digitizer and a display device including the same.

DISCUSSION OF RELATED ART

In general, an electronic device, such as a smartphone, a digital camera, a notebook computer, a car navigation unit, a smart television, or the like, provides an image to a user using a display device that displays an image. For example, the display device may generate an image and provide the image to the user through a display screen.

As display device technology advances, various forms of display devices are being developed. For example, various flexible display devices that can be curved, folded, or rolled are being developed. Flexible display devices may be easy to carry and may improve user convenience.

Among flexible display devices, a foldable display device is a display device that may be folded about a folding axis. The foldable display device may include a display module that is folded about the folding axis and a support part that is disposed under the display module and that supports the display module. The support part may be folded together with the display module.

A foldable display device may further include a digitizer disposed under the display module. The digitizer may recognize the position of a pen by sensing an electromagnetic change caused by the pen contacting or being placed in proximity to the display device.

SUMMARY

Embodiments of the present disclosure provide a digitizer capable of being more easily folded in a dumbbell shape and a display device including the same.

According to an embodiment, a display device includes a display panel including a first non-folding region, a second non-folding region, and a folding region disposed between the first and second non-folding regions, and a digitizer disposed under the display panel and divided into an active region and a non-active region around the active region. The digitizer includes a first sensing coil disposed in a first layer in the active region, a first dummy line disposed in the first layer with the first sensing coil, a second sensing coil disposed in a second layer below the first sensing coil in the active region, a second dummy line disposed in the second layer with the second sensing coil, a bridge line disposed in a third layer below the second sensing coil, and a third dummy line disposed in the third layer with the bridge line. At least two dummy lines among the first, second, and third dummy lines extend in the same direction.

According to an embodiment, a digitizer includes a first sensing coil disposed in a first layer, a first-first dummy line disposed in the first layer with the first sensing coil, a connecting pattern portion disposed in a second layer below the first sensing coil, a first-second dummy line disposed in the second layer with the connecting pattern portion, a second sensing coil disposed in a third layer below the connecting pattern portion, a second dummy line disposed in the third layer with the second sensing coil, a bridge line disposed in a fourth layer below the second sensing coil, and a third dummy line disposed in the fourth layer with the bridge line. The first-first dummy line, the first-second dummy line, and the third dummy line extend in the same direction, and the second dummy line extends in a direction different from the direction in which the first-first dummy line, the first-second dummy line, and the third dummy line extend.

According to an embodiment, a display device includes a display panel including a folding region, the folding region being foldable about a folding axis parallel to a first direction, and a digitizer disposed under the display panel and divided into an active region and a non-active region around the active region. The digitizer includes a plurality of first sensing coils that are disposed in a first layer in the active region and that extend in a second direction crossing the first direction, a plurality of first dummy lines disposed in the first layer with the first sensing coils and disposed between the first sensing coils, a plurality of second sensing coils disposed in a second layer below the first sensing coils in the active region and that extend in the second direction, a plurality of second dummy lines disposed in the second layer with the second sensing coils and disposed between the second sensing coils, a plurality of bridge lines disposed in a third layer below the second sensing coils, and a plurality of third dummy lines disposed in the third layer with the bridge lines. The first and third dummy lines extend in the first direction, and the second dummy lines extend in the second direction.

BRIEF DESCRIPTION OF THE DRAWINGS

The above and other objects and features of the present disclosure will become more apparent by describing in detail embodiments thereof with reference to the accompanying drawings.

DETAILED DESCRIPTION

Figure 1:
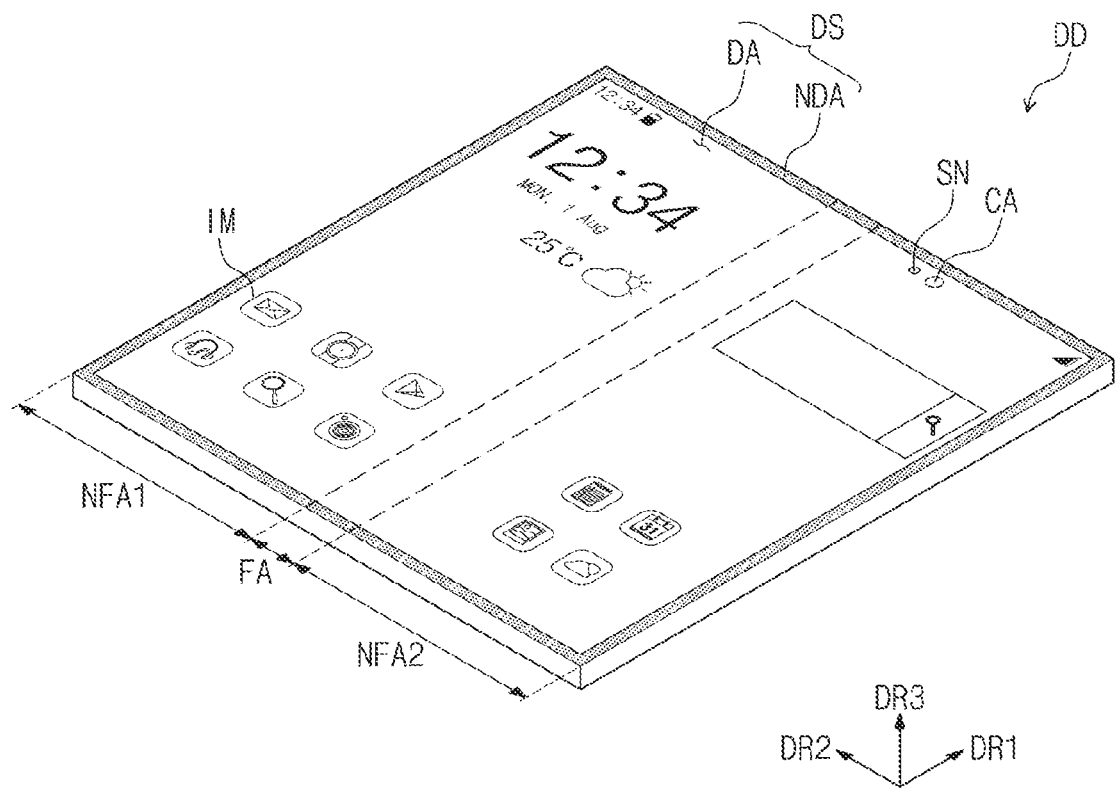
FIG. 1 is a perspective view of a display device according to an embodiment of the present disclosure.

Embodiments of the present disclosure will be described more fully hereinafter with reference to the accompanying drawings. Like reference numerals may refer to like elements throughout the accompanying drawings.

In this specification, when a component (or a region, a layer, a part, etc.) is referred to as being "on", "connected to" or "coupled to" another component, this means that the component may be directly on, connected to, or coupled to the other component, or a third component may be present therebetween.

As used herein, the term "and/or" includes all of one or more combinations defined by related components.

Terms such as first, second, and the like may be used to describe various components, but the components should not be limited by the terms. The terms may be used only for distinguishing one component from other components. For example, without departing the scope of the present disclosure, a first component may be referred to as a second component, and similarly, the second component may also be referred to as the first component. The terms of a singular form may include plural forms unless otherwise specified.

In addition, terms such as "below", "under", "above", and "over" are used to describe a relationship of components illustrated in the drawings. The terms are relative concepts and are described based on directions illustrated in the drawing.

It should be understood that terms such as "comprise", "include", and "have", when used herein, specify the presence of stated features, numbers, steps, operations, components, parts, or combinations thereof, but do not preclude the presence or addition of one or more other features, numbers, steps, operations, components, parts, or combinations thereof.

Figure 2:
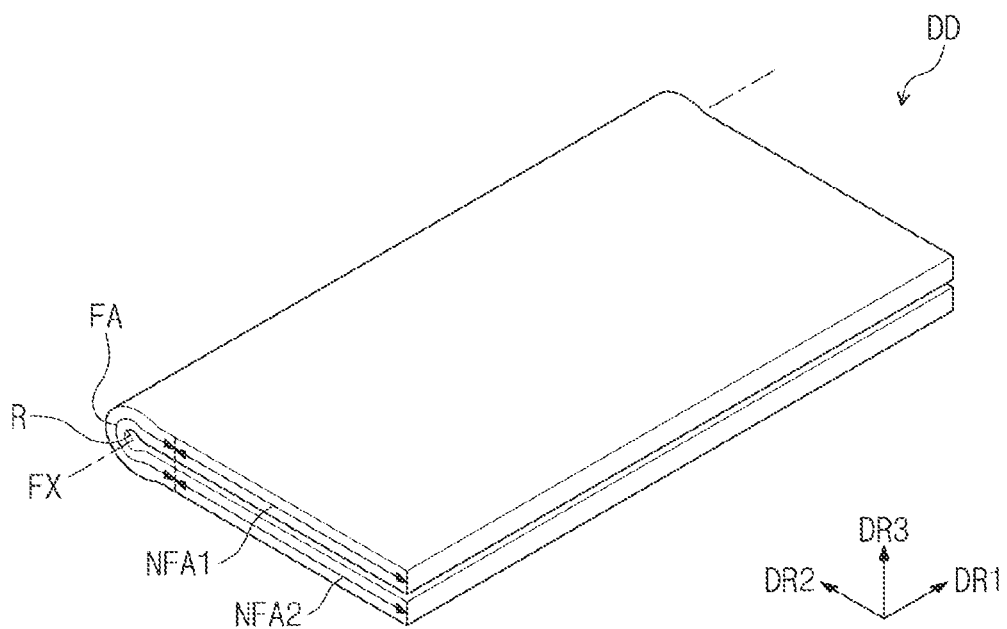
FIG. 2 is a view illustrating a folded state of the display device illustrated in FIG. 1.

FIG. 1 is a perspective view of a display device according to an embodiment of the present disclosure. FIG. 2 is a view illustrating a folded state of the display device illustrated in FIG. 1.

Referring to FIG. 1, the display device DD according to an embodiment of the present disclosure may have a rectangular shape with long sides extending in a first direction DR1 and short sides extending in a second direction DR2 crossing the first direction DR1. However, without being limited thereto, the display device DD may have various shapes such as, for example, a circular shape, a polygonal shape, and the like. The display device DD may be a flexible display device.

Hereinafter, a direction substantially vertically crossing a plane defined by the first direction DR1 and the second direction DR2 is defined as a third direction DR3. Furthermore, the expression "when viewed on the plane" used herein may mean that it is viewed in the third direction DR3.

The display device DD may include a folding region FA and a plurality of non-folding regions NFA1 and NFA2. The non-folding regions NFA1 and NFA2 may include a first non-folding region NFA1 and a second non-folding region NFA2. The folding region FA may be disposed between the first non-folding region NFA1 and the second non-folding region NFA 2. The folding region FA, the first non-folding region NFA1, and the second non-folding region NFA 2 may be arranged in the second direction DR2.

Although one folding region FA and two non-folding regions NFA1 and NFA2 are illustrated as an example, the number of folding regions FA and the number of non-folding regions NFA1 and NFA2 are not limited thereto. For example, the display device DD may include more than two non-folding regions and a plurality of folding regions disposed between the non-folding regions according to embodiments.

An upper surface of the display device DD may be defined as a display surface DS, and the display surface DS may have a plane defined by the first direction DR1 and the second direction DR2. Images IM generated by the display device DD may be provided to a user through the display surface DS.

The display surface DS may include a display region DA and a non-display region NDA around the display region DA. The display region DA may display an image, and an image is not displayed in the non-display region NDA. The non-display region NDA may surround the display region DA and may define a border of the display device DD that is printed in a predetermined color (e.g., a bezel).

The display device DD may include at least one sensor SN and at least one camera CA. The sensor SN and the camera CA may be adjacent to the border of the display device DD. The sensor SN and the camera CA may be disposed in the display region DA adjacent to the non-display region NDA. The sensor SN and the camera CA may be disposed in the second non-folding region NFA2. However, without being limited thereto, the sensor SN and the camera CA may be disposed in the first non-folding region NFA1.

Light may transmit through the portions of the display device DD where the sensor SN and the camera CA are disposed and may be provided to the camera CA and the sensor SN. For example, the sensor SN may be a proximity illuminance sensor. However, the type of sensor SN is not limited thereto. The camera CA may capture an external image. A plurality of sensors SN and a plurality of cameras CA may be provided.

Referring to FIG. 2, the display device DD may be a foldable display device DD that is folded or unfolded. For example, the folding region FA may be bent about a folding axis FX parallel to the first direction DR1, and thus the display device DD may be folded. That is, the folding region FA may be foldable about the folding axis FX. The folding axis FX may be defined as a long axis parallel to the long sides of the display device DD.

When the display device DD is folded, the first non-folding region NFA1 and the second non-folding region NFA2 may face each other, and the display device DD may be folded inward such that the display surface DS is not exposed to the outside. However, embodiments of the present disclosure are not limited thereto. For example, the display device DD may be folded outward about the folding axis FX such that the display surface DS is exposed to the outside.

The distance between the first non-folding region NFA1 and the second non-folding region NFA2 may be smaller than twice the radius of curvature R (e.g., the diameter). In this case, the folding region FA may be folded in a dumbbell shape.

Figure 3:
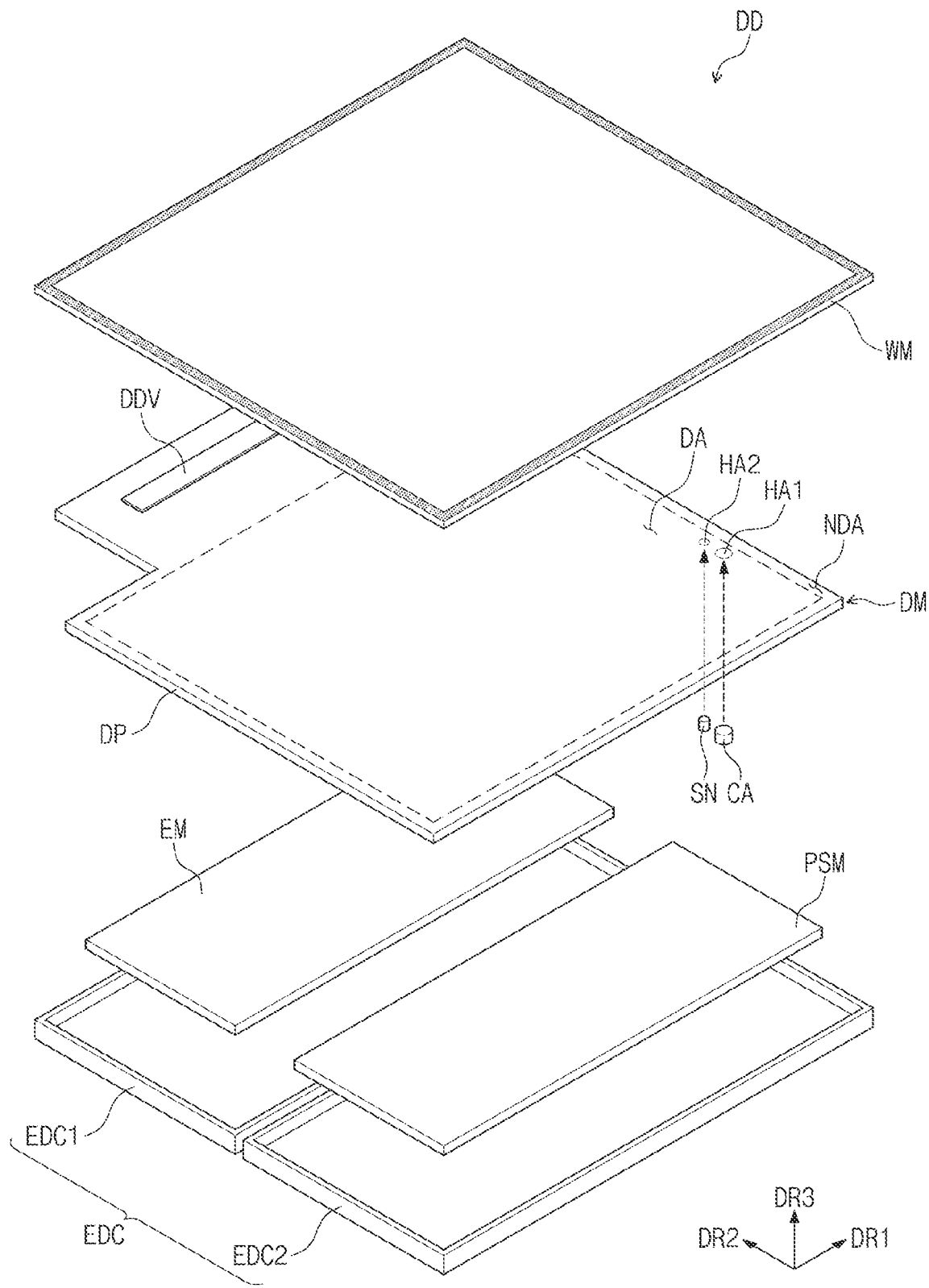
FIG. 3 is an exploded perspective view of the display device illustrated in FIG. 1.

FIG. 3 is an exploded perspective view of the display device illustrated in FIG. 1.

Referring to FIG. 3, the display device DD may include a window module WM, a display module DM, the camera CA, the sensor SN, an electronic module EM, a power supply module PSM, and a case EDC. According to embodiments, the display device DD may further include a mechanical structure (e.g., a hinge) for controlling a folding operation of the display module DM.

The display module DM may generate an image and may detect an external input. The window module WM may define a front surface of the display device DD. The window module WM may be disposed on the display module DM and may protect the display module DM. The window module WM may pass light generated from the display module DM and may provide the light to the user.

The display module DM may include at least a display panel DP. Although only the display panel DP among stacked structures of the display module DM is illustrated in FIG. 3 for convenience if illustration, the display module DM may further include a plurality of components disposed on and under the display panel DP. A detailed stacked structure of the display module DM will be described below in detail. The display panel DP may include a display region DA and a non-display region NDA that correspond to the display region DA (refer to FIG. 1) and the non-display region NDA (refer to FIG. 1) of the display device DD.

The display panel DP may have a first hole region HA1 and a second hole region HA2 defined therein. The first hole region HA1 and the second hole region HA2 may have a higher light transmittance than the surrounding region. The camera CA may be disposed under the first hole region HA1, and the sensor SN may be disposed under the second hole region HA2. Light passing through the first and second hole regions HA1 and HA2 may be provided to the camera CA and the sensor SN, respectively.

The display module DM may include a data driver DDV disposed on the non-display region NDA of the display panel DP. The data driver DDV may be manufactured in the form of an integrated circuit chip and may be mounted on the non-display region NDA. However, without being limited thereto, the data driver DDV may be mounted on a flexible circuit board connected to the display panel DP.

The electronic module EM and the power supply module PSM may be disposed under the display module DM. According to embodiments, the electronic module EM and the power supply module PSM may be connected to each other through a separate flexible circuit board. The electronic module EM may control an operation of the display module DM. The power supply module PSM may supply power to the display module DM.

The case EDC may accommodate the window module WM, the display module DM, the electronic module EM, and the power supply module PSM. To fold the display module DM, the case EDC may include first and second cases EDC1 and EDC2. The first and second cases EDC1 and EDC2 may extend in the first direction DR1 and may be arranged in the second direction DR2.

According to embodiments, the display device DD may further include a hinge structure that connects the first and second cases EDC1 and EDC2. The case EDC may be coupled to the window module WM. The case EDC may protect the window module WM, the display module DM, the electronic module EM, and the power supply module PSM.

Figure 4:
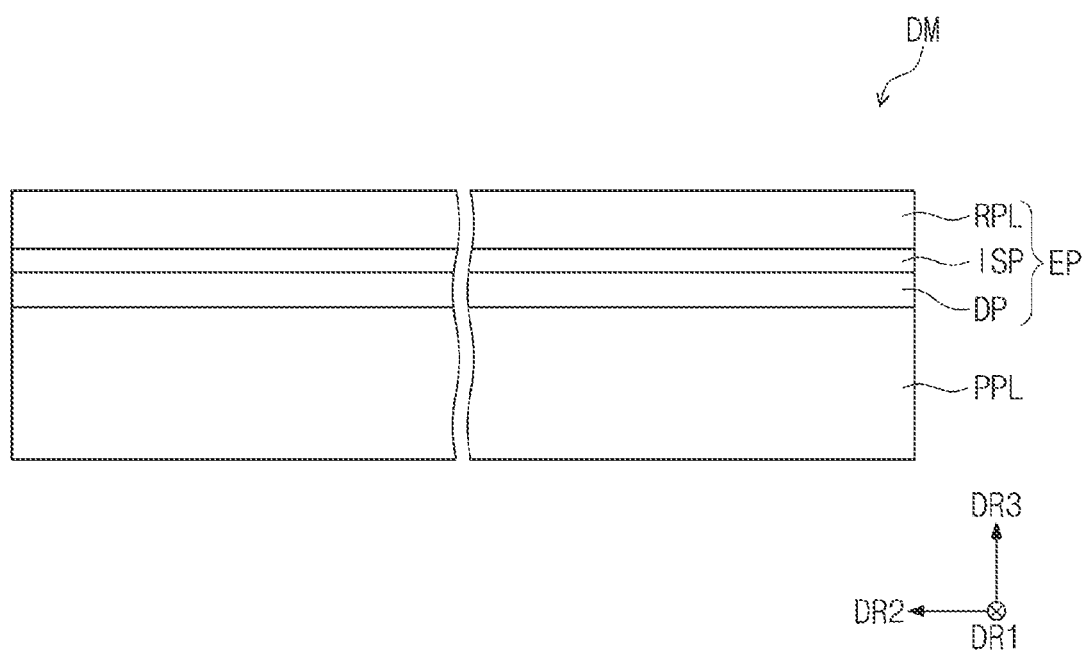
FIG. 4 is a schematic cross-sectional view of a display module illustrated in FIG. 3.

FIG. 4 is a schematic cross-sectional view of the display module illustrated in FIG. 3.

Referring to FIG. 4, the display module DM may include an electronic panel EP and a panel protection layer PPL disposed under the electronic panel EP. The electronic panel EP may include the display panel DP, an input sensing part ISP disposed on the display panel DP, and an anti-reflection layer RPL disposed on the input sensing part ISP. The display panel DP may be a flexible display panel. For example, the display panel DP may include a flexible substrate and a plurality of elements disposed on the flexible substrate.

The display panel DP according to an embodiment of the present disclosure may be an emissive display panel, but is not particularly limited. For example, the display panel DP may be an organic light emitting display panel or an inorganic light emitting display panel. An emissive layer of the organic light emitting display panel may include an organic light emitting material. An emissive layer of the inorganic light emitting display panel may include, for example, quantum dots, quantum rods, and the like. Hereinafter, it will be exemplified that the display panel DP is an organic light emitting display panel.

The input sensing part ISP may include a plurality of sensors that sense an external input in a capacitive manner. The input sensing part ISP may be directly formed on the display panel DP when the display module DM is manufactured.

The anti-reflection layer RPL may be disposed on the input sensing part ISP. The anti-reflection layer RPL may be directly formed on the input sensing part ISP when the display module DM is manufactured. The anti-reflection layer RPL may be a film that prevents or reduces reflection of external light. The anti-reflection layer RPL may decrease the reflectance of external light incident toward the display panel DP from above the display device DD.

For example, the input sensing part ISP may be directly formed on the display panel DP, and the anti-reflection layer RPL may be directly formed on the input sensing part ISP. However, embodiments of the present disclosure are not limited thereto. For example, the input sensing part ISP may be separately manufactured and may be attached to the display panel DP by an adhesive layer, and the anti-reflection layer RPL may be separately manufactured and may be attached to the input sensing part ISP by an adhesive layer.

The panel protection layer PPL may be disposed under the display panel DP. The panel protection layer PPL may protect a lower portion of the display panel DP. The panel protection layer PPL may include a flexible plastic material. For example, the panel protection layer PPL may include polyethylene terephthalate (PET).

Figure 5:
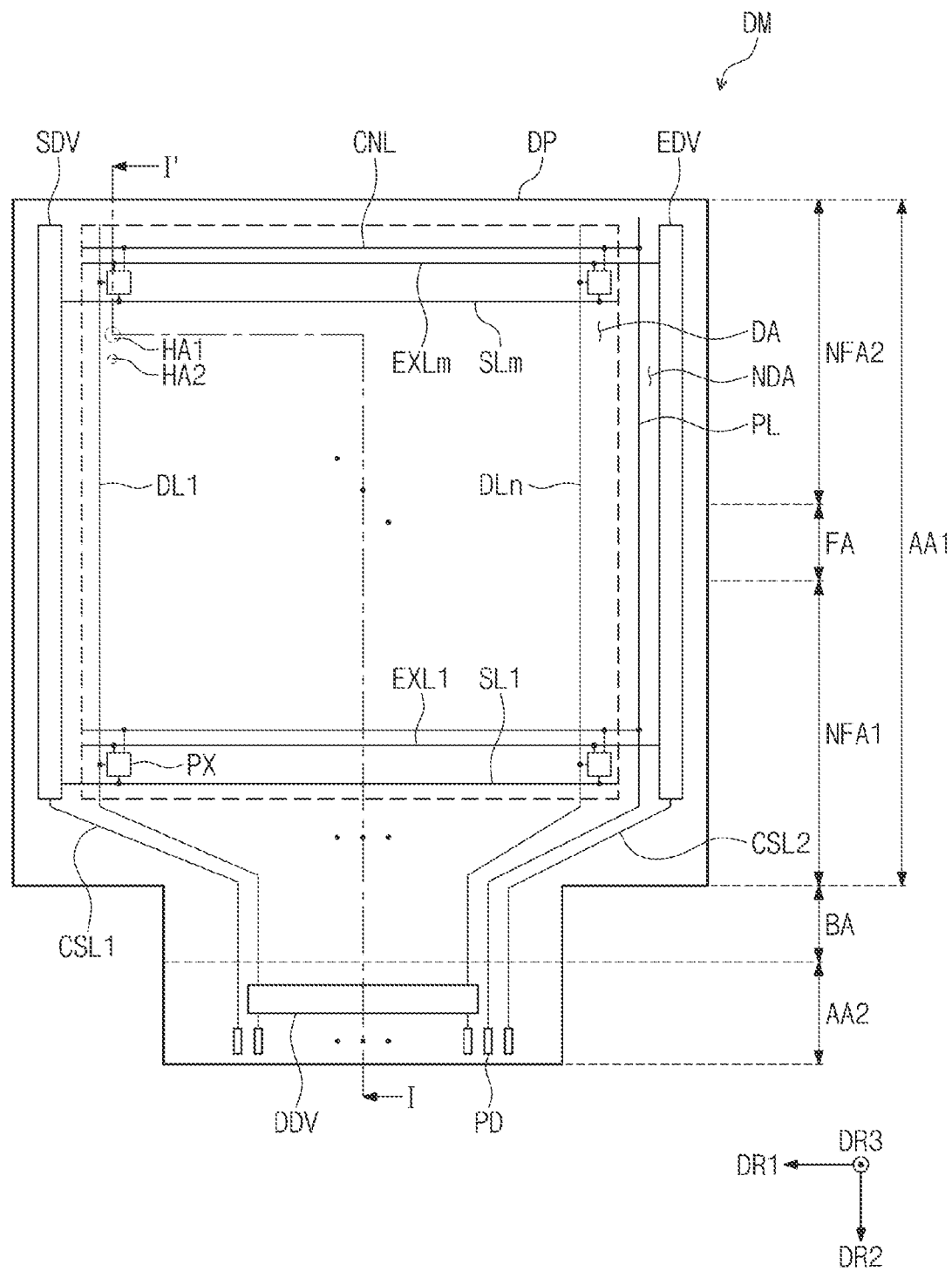
FIG. 5 is a plan view of a display panel illustrated in FIG. 3.

FIG. 5 is a plan view of the display panel illustrated in FIG. 3.

Referring to FIG. 5, the display module DM may include the display panel DP, a scan driver SDV, the data driver DDV, and an emission driver EDV.

The display panel DP may include a first region AA1, a second region AA2, and a bending region BA between the first region AA1 and the second region AA2. The bending region BA may extend in the first direction DR1, and the first region AA1, the bending region BA, and the second region AA2 may be arranged in the second direction DR2.

The first region AA1 may include a display region DA and a non-display region NDA around the display region DA. The non-display region NDA may surround the display region DA. The display region DA may be a region that displays an image, and the non-display region NDA may be a region that does not display an image. The second region AA2 and the bending region BA may be regions that do not display an image.

The first region AA1, when viewed in the first direction DR1, may include a first non-folding region NFA1, a second non-folding region NFA2, and a folding region FA between the first non-folding region NFA1 and the second non-folding region NFA2. The above-described first and second hole regions HA1 and HA2 may be defined in the display region DA and the second non-folding region NFA2.

The display panel DP may include a plurality of pixels PX, a plurality of scan lines SL1 to SLm, a plurality of data lines DL1 to DLn, a plurality of emission lines EXL1 to EXLm, first and second control lines CSL1 and CSL2, a power line PL, a plurality of connecting lines CNL, and a plurality of pads PD, where "m" and "n" are positive integers. The pixels PX may be disposed in the display region DA and may be connected to the scan lines SL1 to SLm, the data lines DL1 to DLn, and the emission lines EXL1 to EXLm.

The scan driver SDV and the emission driver EDV may be disposed in the non-display region NDA. The scan driver SDV and the emission driver EDV may be disposed in the non-display regions NDA adjacent to opposite sides of the first region AA1 that face away from each other in the first direction DR1. The data driver DDV may be disposed in the second region AA2. The data driver DDV may be manufactured in the form of an integrated circuit chip and may be mounted in the second region AA2.

The scan lines SL1 to SLm may extend in the first direction DR1 and may be connected to the scan driver SDV. The data lines DL1 to DLn may extend in the second direction DR2 and may be connected to the data driver DDV via the bending region BA. The emission lines EXL1 to EXLm may extend in the first direction DR1 and may be connected to the emission driver EDV.

The power line PL may extend in the second direction DR2 and may be disposed in the non-display region NDA.

The power line PL may be disposed between the display region DA and the emission driver EDV. However, without being limited thereto, the power line PL may be disposed between the display region DA and the scan driver SDV.

The power line PL may extend to the second region AA2 via the bending region BA. The power line PL may extend toward a lower end of the second region AA2 when viewed on the plane. The power line PL may receive a drive voltage.

The connecting lines CNL may extend in the first direction DR1 and may be arranged in the second direction DR2. The connecting lines CNL may be connected to the power line PL and the pixels PX. The drive voltage may be applied to the pixels PX through the power line PL and the connecting lines CNL connected to each other.

The first control line CSL1 may be connected to the scan driver SDV and may extend toward the lower end of the second region AA2 via the bending region BA. The second control line CSL2 may be connected to the emission driver EDV and may extend toward the lower end of the second region AA2 via the bending region BA. The data driver DDV may be disposed between the first control line CSL1 and the second control line CSL2.

The pads PD may be disposed adjacent to the lower end of the second region AA2 when viewed on the plane. The data driver DDV, the power line PL, the first control line CSL1, and the second control line CSL2 may be connected to the pads PD.

The data lines DL1 to DLn may be connected to the corresponding pads PD through the data driver DDV. For example, the data lines DL1 to DLn may be connected to the data driver DDV, and the data driver DDV may be connected to the pads PD corresponding to the data lines DL1 to DLn.

According to embodiments, a printed circuit board may be connected to the pads PD, and a timing controller and a voltage generator may be disposed on the printed circuit board. The timing controller may be manufactured in the form of an integrated circuit chip and may be mounted on the printed circuit board. The timing controller and the voltage generator may be connected to the pads PD through the printed circuit board.

The timing controller may control operations of the scan driver SDV, the data driver DDV, and the emission driver EDV. The timing controller may generate a scan control signal, a data control signal, and an emission control signal in response to control signals received from outside of the timing controller. The voltage generator may generate the drive voltage.

The scan control signal may be provided to the scan driver SDV through the first control line CSL1. The emission control signal may be provided to the emission driver EDV through the second control line CSL2. The data control signal may be provided to the data driver DDV. The timing controller may receive image signals from outside of the timing controller, may convert the data format of the image signals according to the specification of an interface with the data driver DDV, and may provide the converted signals to the data driver DDV.

The scan driver SDV may generate a plurality of scan signals in response to the scan control signal. The scan signals may be applied to the pixels PX through the scan lines SL1 to SLm. The scan signals may be sequentially applied to the pixels PX.

The data driver DDV may generate a plurality of data voltages corresponding to the image signals in response to the data control signal. The data voltages may be applied to the pixels PX through the data lines DL1 to DLn. The emission driver EDV may generate a plurality of emission signals in response to the emission control signal. The emission signals may be applied to the pixels PX through the emission lines EXL1 to EXLm.

The pixels PX may receive the data voltages in response to the scan signals. The pixels PX may display an image by emitting light having luminance corresponding to the data voltages in response to the emission signals. Light emission time of the pixels PX may be controlled by the emission signals.

Figure 6:
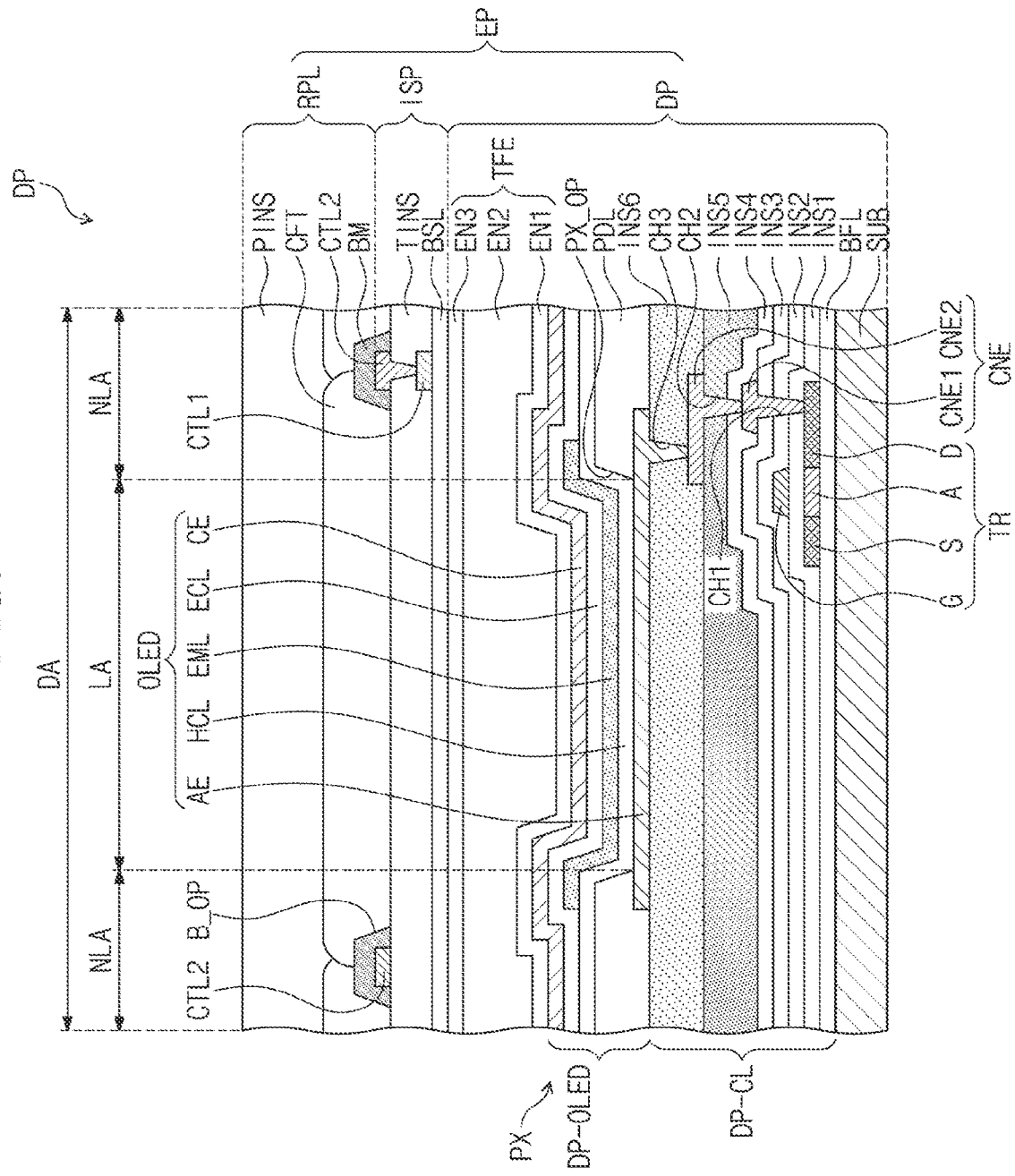
FIG. 6 is a view illustrating a section of an electronic panel corresponding to any one pixel illustrated in FIG. 5.

FIG. 6 is a view illustrating a section of the electronic panel corresponding to any one pixel illustrated in FIG. 5.

Referring to FIG. 6, the pixel PX may include a transistor TR and a light emitting element OLED. The light emitting element OLED may include a first electrode AE (or an anode), a second electrode CE (or a cathode), a hole control layer HCL, an electron control layer ECL, and an emissive layer EML.

The transistor TR and the light emitting element OLED may be disposed on a substrate SUB. Although one transistor TR is illustrated as an example, the pixel PX may include a plurality of transistors and at least one capacitor that drive the light emitting element OLED.

The display region DA may include an emissive region LA corresponding to each of the pixels PX and a non-emissive region NLA around the emissive region LA. The light emitting element OLED may be disposed in the emissive region LA.

A buffer layer BFL may be disposed on the substrate SUB. The buffer layer BFL may be an inorganic layer. A semiconductor pattern may be disposed on the buffer layer BFL. The semiconductor pattern may include, for example, poly silicon, amorphous silicon, or metal oxide.

The semiconductor pattern may be doped with an N-type dopant or a P-type dopant. The semiconductor pattern may include a heavily doped region and a lightly doped region. The heavily doped region may be more heavily doped relative to the lightly doped region. The heavily doped region may have a higher conductivity than the lightly doped region and may substantially serve as a source electrode and a drain electrode of the transistor TR. The lightly doped region may substantially correspond to an active (or channel) region of the transistor.

A source S, an active region A, and a drain D of the transistor TR may be formed from the semiconductor pattern. A first insulating layer INS1 may be disposed on the semiconductor pattern. A gate G of the transistor TR may be disposed on the first insulating layer INS1. A second insulating layer INS2 may be disposed on the gate G. A third insulating layer INS3 may be disposed on the second insulating layer INS2.

To connect the transistor TR and the light emitting element OLED, a connecting electrode CNE may include a first connecting electrode CNE1 and a second connecting electrode CNE2. The first connecting electrode CNE1 may be disposed on the third insulating layer INS3 and may be connected to the drain D through a first contact hole CH1 defined in the first to third insulating layers INS1 to INS3.

A fourth insulating layer INS4 may be disposed on the first connecting electrode CNE1. A fifth insulating layer INS5 may be disposed on the fourth insulating layer INS4. The second connecting electrode CNE2 may be disposed on the fifth insulating layer INS5. The second connecting electrode CNE2 may be connected to the first connecting electrode CNE1 through a second contact hole CH2 defined in the fourth and fifth insulating layers INS4 and INS5.

A sixth insulating layer INS6 may be disposed on the second connecting electrode CNE2. The layers from the buffer layer BFL to the sixth insulating layer INS6 may be defined as a circuit element layer DP-CL. The first to sixth insulating layers INS1 to INS6 may be inorganic layers or organic layers.

The first electrode AE may be disposed on the sixth insulating layer INS6. The first electrode AE may be connected to the second connecting electrode CNE2 through a third contact hole CH3 defined in the sixth insulating layer INS6. A pixel defining layer PDL having an opening PX_OP defined therein that exposes a predetermined portion of the first electrode AE may be disposed on the first electrode AE and the sixth insulating layer INS6.

The hole control layer HCL may be disposed on the first electrode AE and the pixel defining layer PDL. The hole control layer HCL may include a hole transport layer and a hole injection layer.

The emissive layer EML may be disposed on the hole control layer HCL. The emissive layer EML may be disposed in a region corresponding to the opening PX_OP. The emissive layer EML may include an organic material and/or an inorganic material. The emissive layer EML may generate any one of red light, green light, and blue light.

The electron control layer ECL may be disposed on the emissive layer EML and the hole control layer HCL. The electron control layer ECL may include an electron transport layer and an electron injection layer. The hole control layer HCL and the electron control layer ECL may be commonly disposed in the emissive region LA and the non-emissive region NLA.

The second electrode CE may be disposed on the electron control layer ECL. The second electrode CE may be commonly disposed for the pixels PX. The layer having the light emitting element OLED disposed therein may be defined as a display element layer DP-OLED.

A thin film encapsulation layer TFE may be disposed on the second electrode CE and may cover the pixel PX. The thin film encapsulation layer TFE may include a first encapsulation layer EN1 disposed on the second electrode CE, a second encapsulation layer EN2 disposed on the first encapsulation layer EN1, and a third encapsulation layer EN3 disposed on the second encapsulation layer EN2.

The first and third encapsulation layers EN1 and EN3 may include inorganic insulating layers and may protect the pixel PX from moisture/oxygen. The second encapsulation layer EN2 may include an organic insulating layer and may protect the pixel PX from foreign matter such as dust particles.

A first voltage may be applied to the first electrode AE through the transistor TR, and a second voltage having a lower level than the first voltage may be applied to the second electrode CE. Holes and electrons injected into the emissive layer EML may be combined to form excitons, and the light emitting element OLED may emit light as the excitons transition to a ground state.

The input sensing part ISP may be disposed on the thin film encapsulation layer TFE. The input sensing part ISP may be directly manufactured on an upper surface of the thin film encapsulation layer TFE.

A base layer BSL may be disposed on the thin film encapsulation layer TFE. The base layer BSL may include an inorganic insulating layer. At least one inorganic insulating layer may be provided on the thin film encapsulation layer TFE as the base layer BSL.

The input sensing part ISP may include a first conductive pattern CTL1 and a second conductive pattern CTL2 disposed on the first conductive pattern CTL1. The first conductive pattern CTL1 may be disposed on the base layer BSL. An insulating layer TINS may be disposed on the base layer BSL and may cover the first conductive pattern CTL1. The insulating layer TINS may include an inorganic insulating layer or an organic insulating layer. The second conductive pattern CTL2 may be disposed on the insulating layer TINS.

The first and second conductive patterns CTL1 and CTL2 may overlap the non-emissive region NLA. According to embodiments, the first and second conductive patterns CTL1 and CTL2 may be disposed in the non-emissive region NLA between adjacent emissive regions LA and may have a mesh shape.

The first and second conductive patterns CTL1 and CTL2 may form the above-described sensors of the input sensing part ISP. For example, the first and second conductive patterns CTL1 and CTL2 having a mesh shape may be separated from each other in a predetermined region to form the sensors. A portion of the second conductive pattern CTL2 may be connected to the first conductive pattern CTL1.

The anti-reflection layer RPL may be disposed on the second conductive pattern CTL2. The anti-reflection layer RPL may include a black matrix BM and a plurality of color filters CFT. The black matrix BM may overlap the non-emissive region NLA, and the color filters CFT may overlap the emissive regions LA.

The black matrix BM may be disposed on the insulating layer TINS and may cover the second conductive pattern CTL2. An opening B_OP overlapping the emissive region LA and the opening PX_OP may be defined in the black matrix BM. The black matrix BM may absorb and block light. The width of the opening B_OP may be greater than the width of the opening PX_OP.

The color filters CFT may be disposed on the insulating layer TINS and the black matrix BM. The color filters CFT may be disposed in the openings B_OP, respectively. A planarization insulating layer PINS may be disposed on the color filters CFT. The planarization insulating layer PINS may provide a flat upper surface.

When external light travelling toward the display panel DP is reflected from the display panel DP and provided back to the user, the user may visually recognize the external light (e.g., as may occur when viewing a mirror). To prevent such a phenomenon, the anti-reflection layer RPL may include the plurality of color filters CF that display the same colors as those of the pixels PX of the display panel DP. The color filters CF may filter external light into the same colors as the pixels PX. In this case, the external light is not visible to the user according to embodiments.

However, embodiments of the present disclosure are not limited thereto, and the anti-reflection layer RPL may include a polarizer film to decrease the reflectance of external light. The polarizer film may be separately manufactured and may be attached to the input sensing part ISP by an adhesive layer. The polarizer film may include a phase retarder and/or a polarizer.

Figure 7:
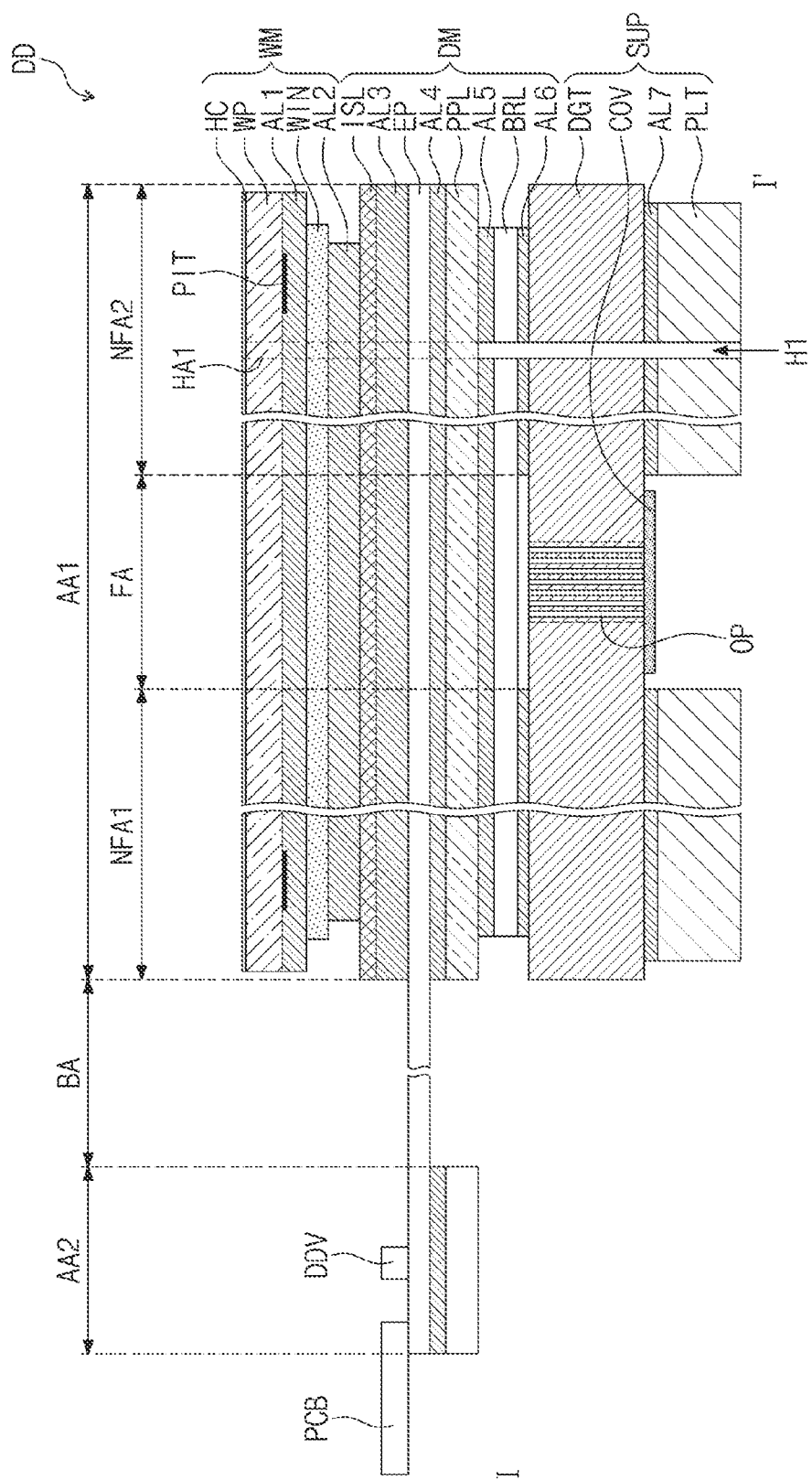
FIG. 7 is a cross-sectional view taken along line I-I' illustrated in FIG. 5.
Figure 8:
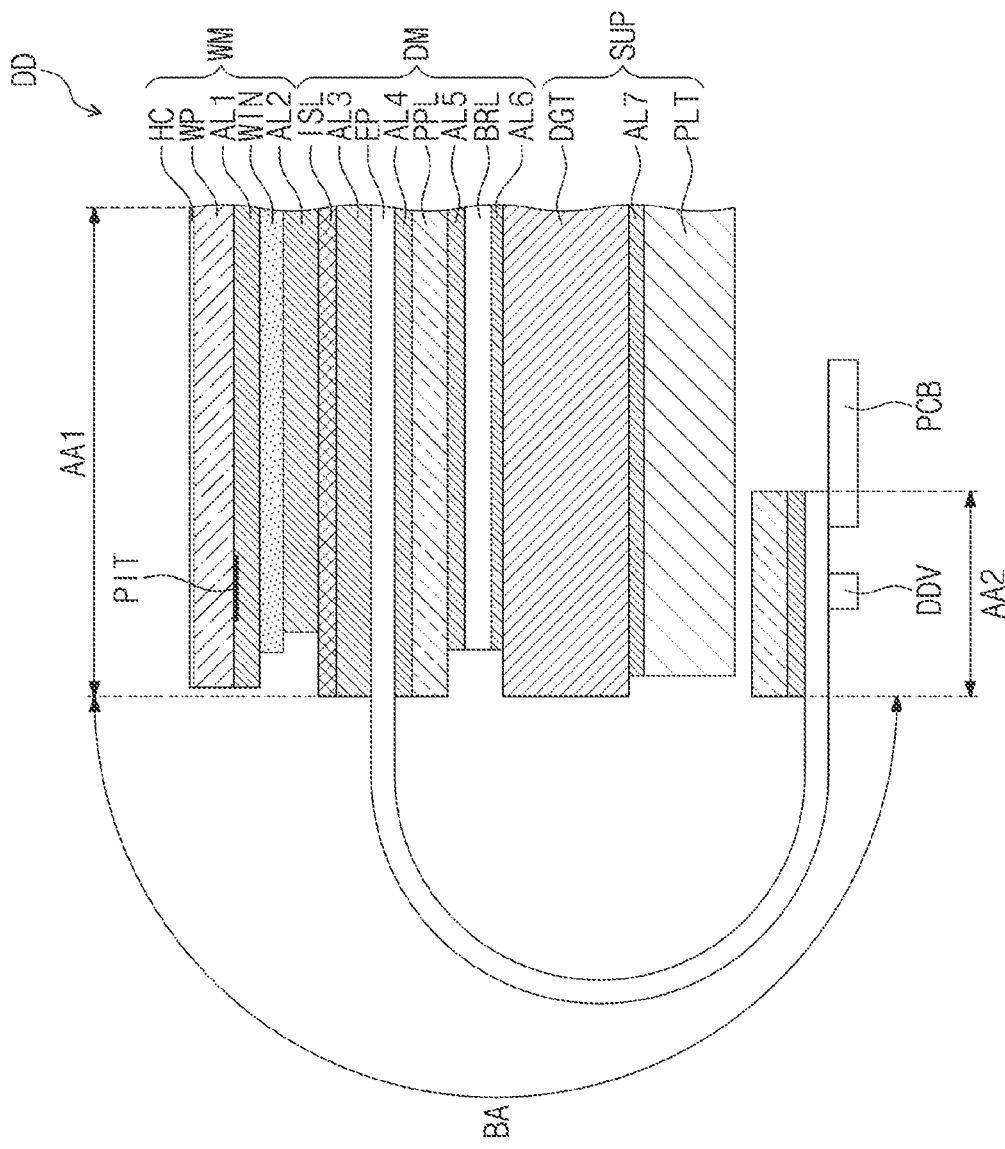
FIG. 8 is a view illustrating a state in which a bending region illustrated in FIG. 7 is bent.

FIG. 7 is a cross-sectional view taken along line I-I' illustrated in FIG. 5. FIG. 8 is a view illustrating a state in which the bending region illustrated in FIG. 7 is bent.

A section of the display module DM and a section of the window module WM that correspond to line I-I' are illustrated together in FIG. 7.

Referring to FIG. 7, the display device DD may include the display module DM, the window module WM disposed on the display module DM, and a support part SUP disposed under the display module DM. The display module DM may be a flexible display module. The display module DM may include the first non-folding region NFA1, the folding region FA, and the second non-folding region NFA2.

The window module WM may include a window WIN, a window protection layer WP, a hard coating layer HC, and first and second adhesive layers AL1 and AL2. The display module DM may include the electronic panel EP, an impact absorbing layer ISL, the panel protection layer PPL, a barrier layer BRL, and third to sixth adhesive layers AL3, AL4, AL5 and AL6. The support part SUP may include a digitizer DGT, a support plate PLT, a cover layer COV, and a seventh adhesive layer AL7.

The configurations of the electronic panel EP and the panel protection layer PPL have been described above in detail with reference to FIG. 4, and therefore descriptions thereof will be omitted. The impact absorbing layer ISL may be disposed on the electronic panel EP. The impact absorbing layer ISL may protect the electronic panel EP by absorbing an external impact applied toward the electronic panel EP from above the display device DD. The impact absorbing layer ISL may be manufactured in the form of a stretchable film.

The impact absorbing layer ISL may include a flexible plastic material. The flexible plastic material may be defined as a synthetic resin film. For example, the impact absorbing layer ISL may include a flexible plastic material such as polyimide (PI) or polyethylene terephthalate (PET).

The window WIN may be disposed on the impact absorbing layer ISL. The window WIN may protect the electronic panel EP from external scratches. The window WIN may have a property of being optically clear. The window WIN may include glass. However, without being limited thereto, the window WIN may include a synthetic resin film.

The window WIN may have a multi-layer structure or a single-layer structure. For example, the window WIN may include a plurality of synthetic resin films coupled by an adhesive, or may include a glass substrate and a synthetic resin film coupled by an adhesive.

The window protection layer WP may be disposed on the window WIN. The window protection layer WP may include a flexible plastic material such as polyimide or polyethylene terephthalate. The hard coating layer HC may be disposed on an upper surface of the window protection layer WP.

A printed layer PIT may be disposed on a lower surface of the window protection layer WP. The printed layer PIT may be black in color, but the color of the printed layer PIT is not limited thereto. The printed layer PIT may be adjacent to the periphery of the window protection layer WP.

The barrier layer BRL may be disposed under the panel protection layer PPL. The barrier layer BRL may increase resistance to a compressive force caused by external pressing. Accordingly, the barrier layer BRL may serve to prevent deformation of the electronic panel EP. The barrier layer BRL may include a flexible plastic material such as polyimide or polyethylene terephthalate.

The barrier layer BRL may have a color that absorbs light. For example, the barrier layer BRL may be black in color. In this case, according to embodiments, components disposed under the barrier layer BRL are not visible when the display module DM is viewed from above the display module DM.

The first adhesive layer AL1 may be disposed between the window protection layer WP and the window WIN. The window protection layer WP and the window WIN may be bonded to each other by the first adhesive layer AL1. The first adhesive layer AL1 may cover the printed layer PIT.

The second adhesive layer AL2 may be disposed between the window WIN and the impact absorbing layer ISL. The window WIN and the impact absorbing layer ISL may be bonded to each other by the second adhesive layer AL2.

The third adhesive layer AL3 may be disposed between the impact absorbing layer ISL and the electronic panel EP. The impact absorbing layer ISL and the electronic panel EP may be bonded to each other by the third adhesive layer AL3.

The fourth adhesive layer AL4 may be disposed between the electronic panel EP and the panel protection layer PPL. The electronic panel EP and the panel protection layer PPL may be bonded to each other by the fourth adhesive layer AL4.

The fifth adhesive layer AL5 may be disposed between the panel protection layer PPL and the barrier layer BRL. The panel protection layer PPL and the barrier layer BRL may be bonded to each other by the fifth adhesive layer AL5.

The sixth adhesive layer AL6 may be disposed between the barrier layer BRL and the digitizer DGT. The barrier layer BRL and the digitizer DGT may be bonded to each other by the sixth adhesive layer AL6.

According to embodiments, the sixth adhesive layer AL6 may overlap the first and second non-folding regions NFA1 and NFA2 and does not overlap the folding region FA. That is, according to embodiments, the sixth adhesive layer AL6 is not disposed in the folding region FA.

The digitizer DGT may be disposed under the barrier layer BRL. The digitizer DGT may include a plurality of layers, and this configuration will be described below in detail.

Under the display module DM, the digitizer DGT may serve to support the display module DM. For example, to have a higher stiffness than the display module DM, the digitizer DGT may include a non-metallic material such as a fiber reinforced composite. The fiber reinforced composite may be carbon fiber reinforced plastic (CFRP) or glass fiber reinforced plastic (GFRP). Hereinafter, the digitizer DGT will be described as a structure including a glass fiber reinforced plastic.

The digitizer DGT is a device that receives an input of location information that the user provides via the display surface. The digitizer DGT may be implemented in an electromagnetic type (or an electromagnetic resonance type). For example, the digitizer DGT may include a digitizer sensor substrate that includes a plurality of coils. However, without being limited thereto, the digitizer DGT may be implemented in an active electrostatic type.

When the user moves an electromagnetic pen on the display device DD, the electromagnetic pen may be driven by an AC signal to cause an oscillating magnetic field, and the oscillating magnetic field may induce a signal to the coils. The position of the electromagnetic pen may be detected through the signal induced to the coils. The digitizer DGT may recognize the position of the electromagnetic pen by sensing an electromagnetic change caused by access of the electromagnetic pen.

A plurality of openings OP may be defined in the portion of the digitizer DGT that overlaps the folding region FA. The openings OP may be formed through portions of the digitizer DGT in the third direction DR3. The openings OP may be formed in the digitizer DGT through, for example, a laser process or a micro-blast process.

Since the openings OP are defined in the portion of the digitizer DGT that overlaps the folding region FA, the flexibility of the portion of the digitizer DGT that overlaps the folding region FA may be increased. Thus, the digitizer DGT may be easily folded about the folding region FA.

The cover layer COV may be disposed under the digitizer DGT. Under the digitizer DGT, the cover layer COV may cover the openings OP defined in the digitizer DGT. According to embodiments, the cover layer COV may overlap the folding region FA and does not overlap the first and second non-folding regions NFA1 and NFA2. That is, according to embodiments, the cover layer COV is not disposed in the first and second non-folding regions NFA1 and NFA2. The cover layer COV may make contact with a lower surface of the portion of the digitizer DGT in which the openings OP are formed.

The cover layer COV may have a lower elastic modulus than the digitizer DGT. For example, the cover layer COV may include thermoplastic poly-urethane or rubber, but the material of the cover layer COV is not limited thereto. The cover layer COV may be manufactured in a sheet form and may be attached to the digitizer DGT.

The support plate PLT may be disposed under the digitizer DGT. According to embodiments, the support plate PLT may overlap the first and second non-folding regions NFA1 and NFA2 and does not overlap the folding region FA. The support plate PLT may be divided into two support plates, and the two support plates may be disposed under the first and second non-folding regions NFA1 and NFA2, respectively.

The support plate PLT may have a higher stiffness than the display module DM. The support plate PLT may include a metallic material such as, for example, stainless steel (e.g., SUS 316), but the metallic material of the support plate PLT is not limited thereto. Furthermore, without being limited thereto, the support plate PLT may include a non-metallic material such as plastic.

The seventh adhesive layer AL7 may be disposed between the digitizer DGT and the support plate PLT. The digitizer DGT and the support plate PLT may be bonded to each other by the seventh adhesive layer AL7. According to embodiments, the seventh adhesive layer AL7 is not disposed in the folding region FA.

The first to seventh adhesive layers AL1 to AL7 may include a transparent adhesive such as, for example, a pressure sensitive adhesive (PSA) or an optically clear adhesive (OCA), but are not limited thereto.

A first hole H1 may be defined in the portion of the display module DM that overlaps the first hole region HAL. The first hole H1 may be defined in the layers from the support plate PLT to the layer under the panel protection layer PPL. For example, the first hole H1 may be integrally defined in the barrier layer BRL, the digitizer DGT, the support plate PLT, and the fifth to seventh adhesive layers AL5 to AL7.

According to embodiments, a second hole may be formed in the second hole region HA2. Similar to the first hole H1, the second hole may also be defined in the layers from the support plate PLT to the layer under the panel protection layer PPL. The above-described camera CA may be disposed in the first hole H1, and the above-described sensor SN may be disposed in the second hole.

Referring to FIGS. 7 and 8, according to embodiments, the panel protection layer PPL and the fourth adhesive layer AL4 are not disposed under the bending region BA. The panel protection layer PPL and the fourth adhesive layer AL4 may be disposed under the second region AA2 of the electronic panel EP. The data driver DDV may be disposed in the second region AA2 of the electronic panel EP.

A printed circuit board PCB may be connected to the second region AA2 of the electronic panel EP. The printed circuit board PCB may be connected to one side of the second region AA2. As the bending region BA is bent, the second region AA2 may be disposed under the first region AA1. Accordingly, the data driver DDV and the printed circuit board PCB may be disposed under the first region AA1.

Figure 9:
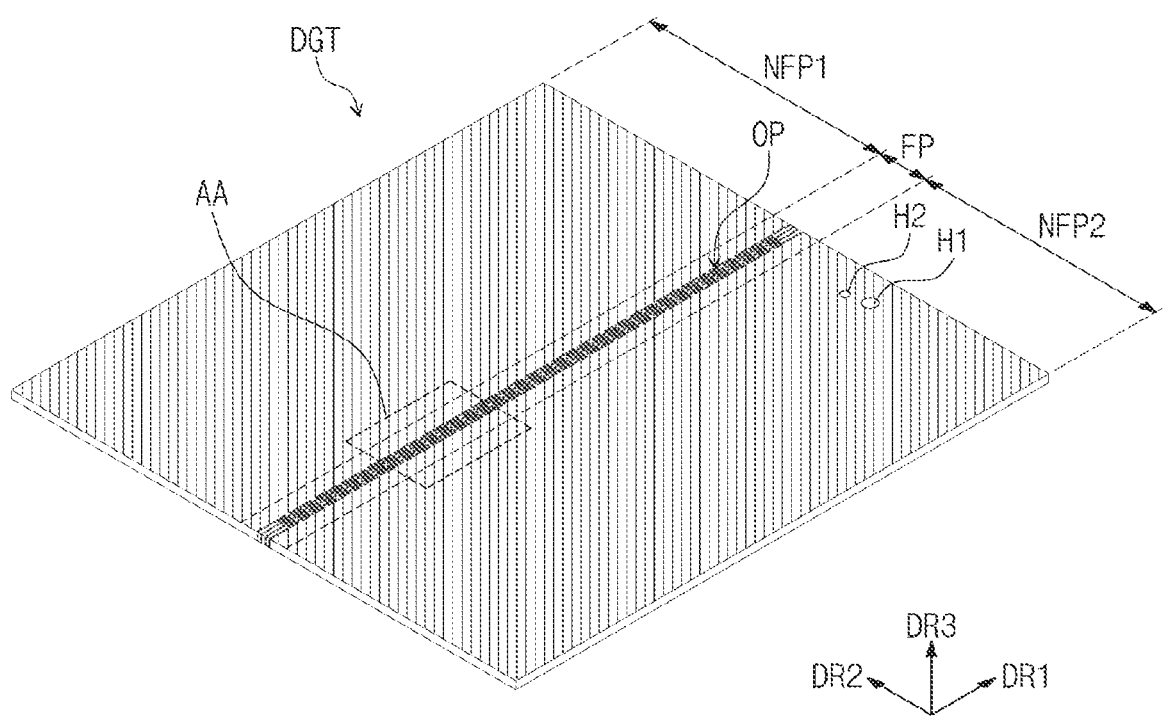
FIG. 9 is a perspective view of a digitizer illustrated in FIG. 7.

FIG. 9 is a perspective view of the digitizer illustrated in FIG. 7.

Referring to FIG. 9, the digitizer DGT may include a first non-folding portion NFP1, a folding portion FP, and a second non-folding portion NFP2 arranged in the second direction DR2. The first non-folding portion NFP1, the folding portion FP, and the second non-folding portion NFP2 may overlap the first non-folding region NFA1, the folding region FA, and the second non-folding region NFA2, respectively.

A grid pattern may be defined in the folding portion FP. For example, the plurality of openings OP may be defined in the folding portion FP. The openings OP may be arranged according to a predetermined rule. The openings OP may be arranged in a grid form and may form the grid pattern of the folding portion FP. Based on the second direction DR2, the region in which the openings OP are formed may have a smaller width than the folding portion FP.

As the openings OP are defined in the folding portion FP, the area of the folding portion FP may be decreased, and thus, the stiffness of the folding portion FP may be lowered. Accordingly, when the openings OP are defined in the folding portion FP, the flexibility of the folding portion FP may be increased, as compared with when the openings OP are not defined in the folding portion FP. Thus, the folding portion FP may be more easily folded.

The first hole H1 and the second hole H2 described above may be defined in the second non-folding portion NFP2. The first hole H1 and the second hole H2 may be adjacent to the periphery of the second non-folding portion NFP2.

Figure 10:
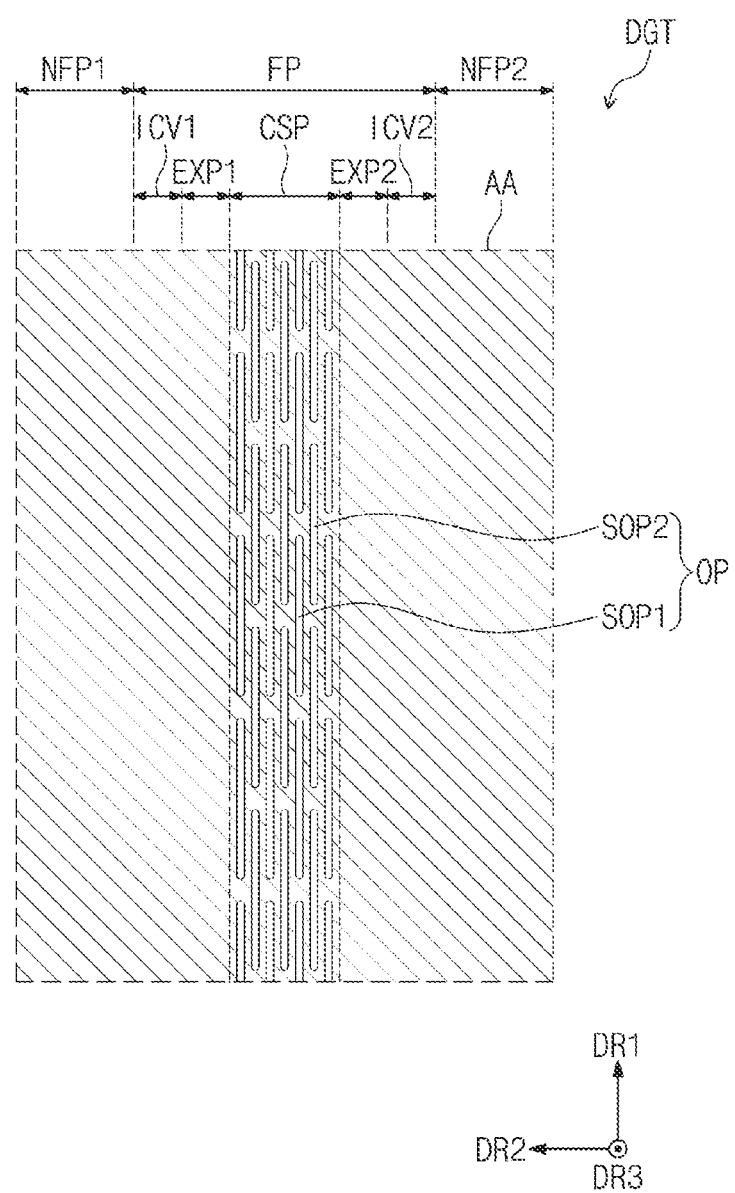
FIG. 10 is an enlarged plan view of region AA illustrated in FIG. 9.

FIG. 10 is an enlarged plan view of region AA illustrated in FIG. 9.

Referring to FIG. 10, the folding portion FP may include a curved surface portion CSP, a first extension EXP1, a second extension EXP2, a first inverse curvature portion ICV1, and a second inverse curvature portion ICV2. The curved surface portion CSP, the first extension EXP1, the second extension EXP2, the first inverse curvature portion ICV1, and the second inverse curvature portion ICV2 may be arranged in the second direction DR2.

For example, the curved surface portion CSP may be disposed in the center of the folding portion FP. The first inverse curvature portion ICV1 may be defined as a portion of the folding portion FP that is adjacent to the first non-folding portion NFP1. The second inverse curvature portion ICV2 may be defined as a portion of the folding portion FP that is adjacent to the second non-folding portion NFP2.

The curved surface portion CSP may be disposed between the first extension EXP1 and the second extension EXP2. The first extension EXP1 may be disposed between the first inverse curvature portion ICV1 and the curved surface portion CSP. The second extension EXP2 may be disposed between the second inverse curvature portion ICV2 and the curved surface portion CSP.

The first inverse curvature portion ICV1 may be disposed between the first non-folding portion NFP1 and the first extension EXP1. The second inverse curvature portion ICV2 may be disposed between the second non-folding portion NFP2 and the second extension EXP2.

The openings OP may be defined in the curved surface portion CSP. The openings OP may be arranged in the first direction DR1 and the second direction DR2. The openings OP may extend longer in the first direction DR1 than in the second direction DR2. That is, a length of the openings in the first direction DR1 may be greater than the length of the openings in the second direction DR2. The openings OP may extend in a direction parallel to the above-described folding axis FX.

The openings OP may include first sub-openings SOP1 arranged in an $h^{th}$ column and second sub-openings SOP2 arranged in an $(h+1)^{th}$ column, where "h" is a positive integer. The columns may correspond to the first direction DR1. The second sub-openings SOP2 may be adjacent to the first sub-openings SOP1 in the second direction DR2. The first sub-openings SOP1 may be staggered with respect to the second sub-openings OP2.

Figure 11:
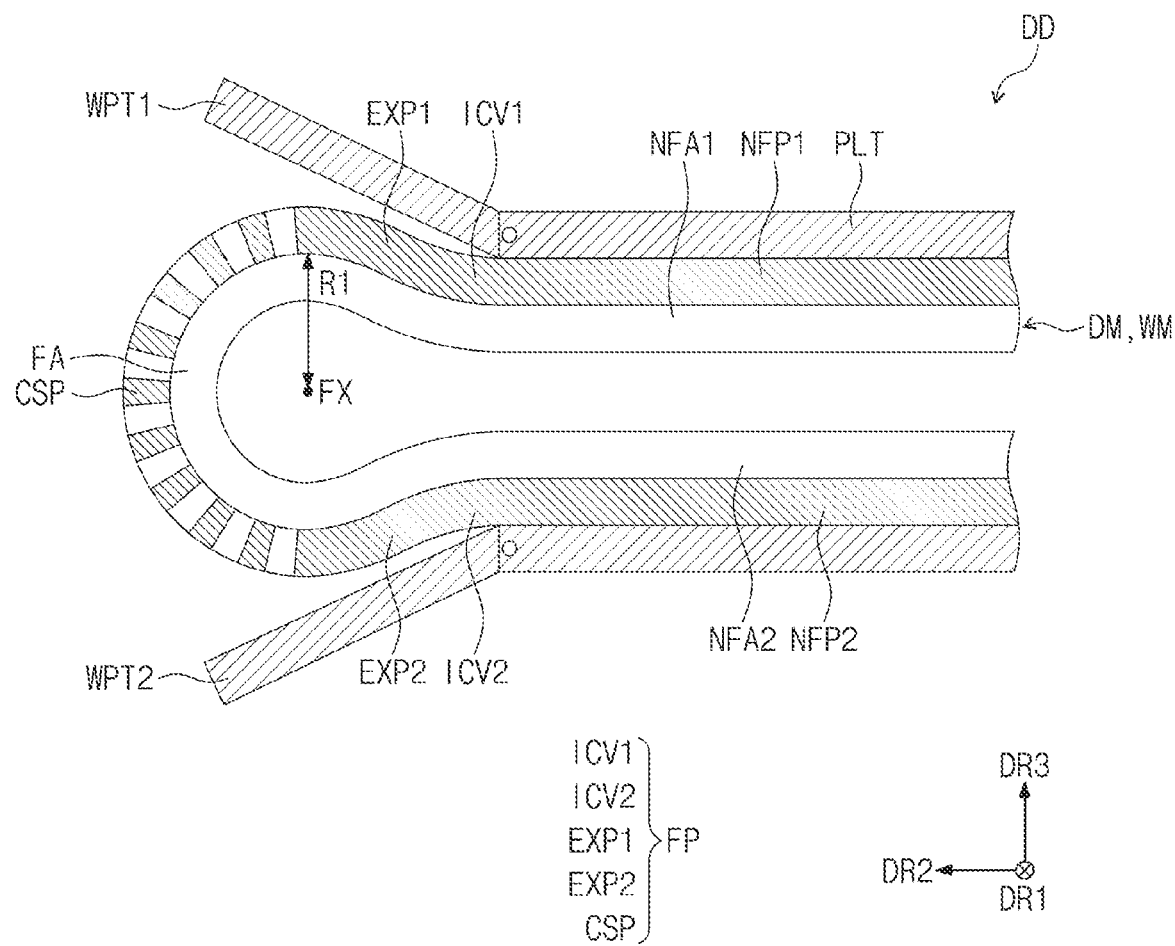
FIG. 11 is a view illustrating a folded state of the display device illustrated in FIG. 7.

FIG. 11 is a view illustrating a folded state of the display device illustrated in FIG. 7.

For convenience of illustration, the bending region BA and the second region AA2 illustrated in FIG. 7 are omitted in FIG. 11. Furthermore, the display module DM and the window module WM are illustrated together as a single layer, and the adhesive layers AL6 and AL7 and the cover layer COV are omitted.

Referring to FIG. 11, the display device DD may be folded inward about the folding axis FX. The folding region FA may be bent, and thus, the first non-folding region NFA1 and the second non-folding region NFA 2 may face each other. The display device DD may be changed from a first state (a flat state) illustrated in FIG. 7 to a second state (a folded state) illustrated in FIG. 11, or may be changed from the second state to the first state. The folding operation may be repeatedly performed.

Since the display module DM is a flexible display module, the folding region FA of the display module DM may be easily bent. Since the plurality of openings OP overlapping the folding region FA are defined in the digitizer DGT, the folding portion FP may be easily bent by the openings OP.

The digitizer DGT may be folded in a dumbbell shape. When the folding portion FP is folded, the curved surface portion CSP may be bent with a predetermined curvature. The curved surface portion CSP may be bent with a first radius of curvature R1.

The first inverse curvature portion ICV1 may be bent opposite to the curved surface portion CSP. The second inverse curvature portion ICV2 may be bent opposite to the curved surface portion CSP. The second inverse curvature portion ICV2 may have a shape symmetrical to that of the first inverse curvature portion ICV1.

When the folding portion FP is folded, the support plate PLT may be disposed on lower surfaces of the first and second non-folding portions NFP1 and NFP2 and may remain in a flat state. The support plate PLT may allow the first and second non-folding regions NFA1 and NFA2 and the first and second non-folding portions NFP1 and NFP2 to remain flat.

When the folding portion FP is folded, the distance between the first non-folding portion NFP1 and the second non-folding portion NFP2 in the third direction DR3 may be smaller than twice the first radius of curvature R1 (e.g., the diameter). According to this configuration, the digitizer DGT may be folded in a dumbbell shape.

To allow the digitizer DGT to maintain the dumbbell shape, the display device DD may further include a first wing plate WPT1 and a second wing plate WPT2. The first wing plate WPT1 may be disposed on lower surfaces of the first inverse curvature portion ICV1 and the first extension EXP1, and the second wing plate WPT2 may be disposed on lower surfaces of the second inverse curvature portion ICV2 and the second extension EXP2.

The first wing plate WPT1 and the second wing plate WPT2 may be rotatably coupled to the support plate PLT disposed on the lower surfaces of the first and second non-folding portions NFP1 and NFP2. The first wing plate WPT1 and the second wing plate WPT2 may rotate relative to the support plate PLT to form a predetermined angle with the support plate PLT.

The first wing plate WPT1 may support the first inverse curvature portion ICV1 and the first extension EXP1. The second wing plate WPT2 may support the second inverse curvature portion ICV2 and the second extension EXP2.

Figure 12:
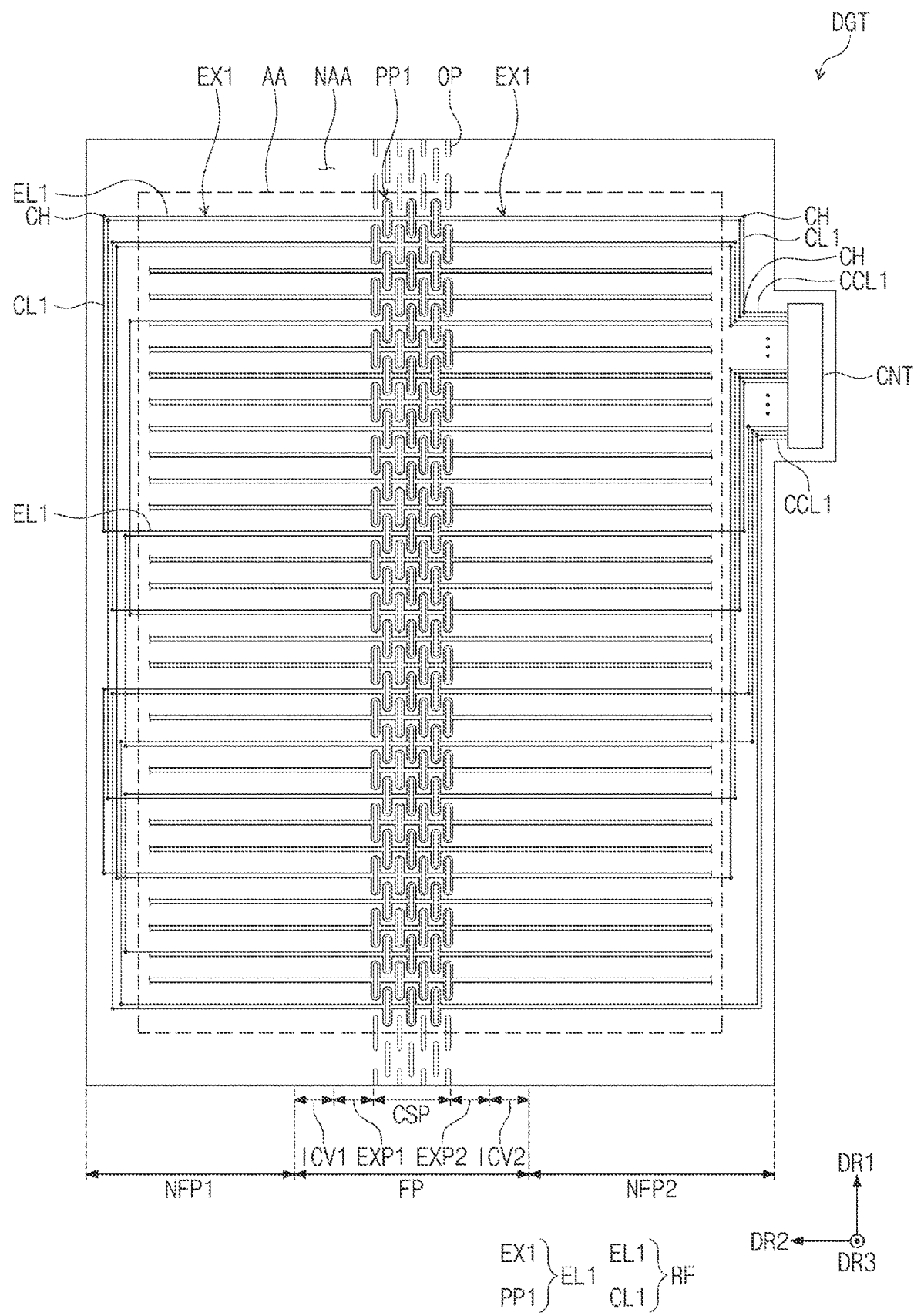
FIG. 12 is a plan view of the digitizer illustrating first sensing coils of the digitizer illustrated in FIG. 7.
Figure 13:
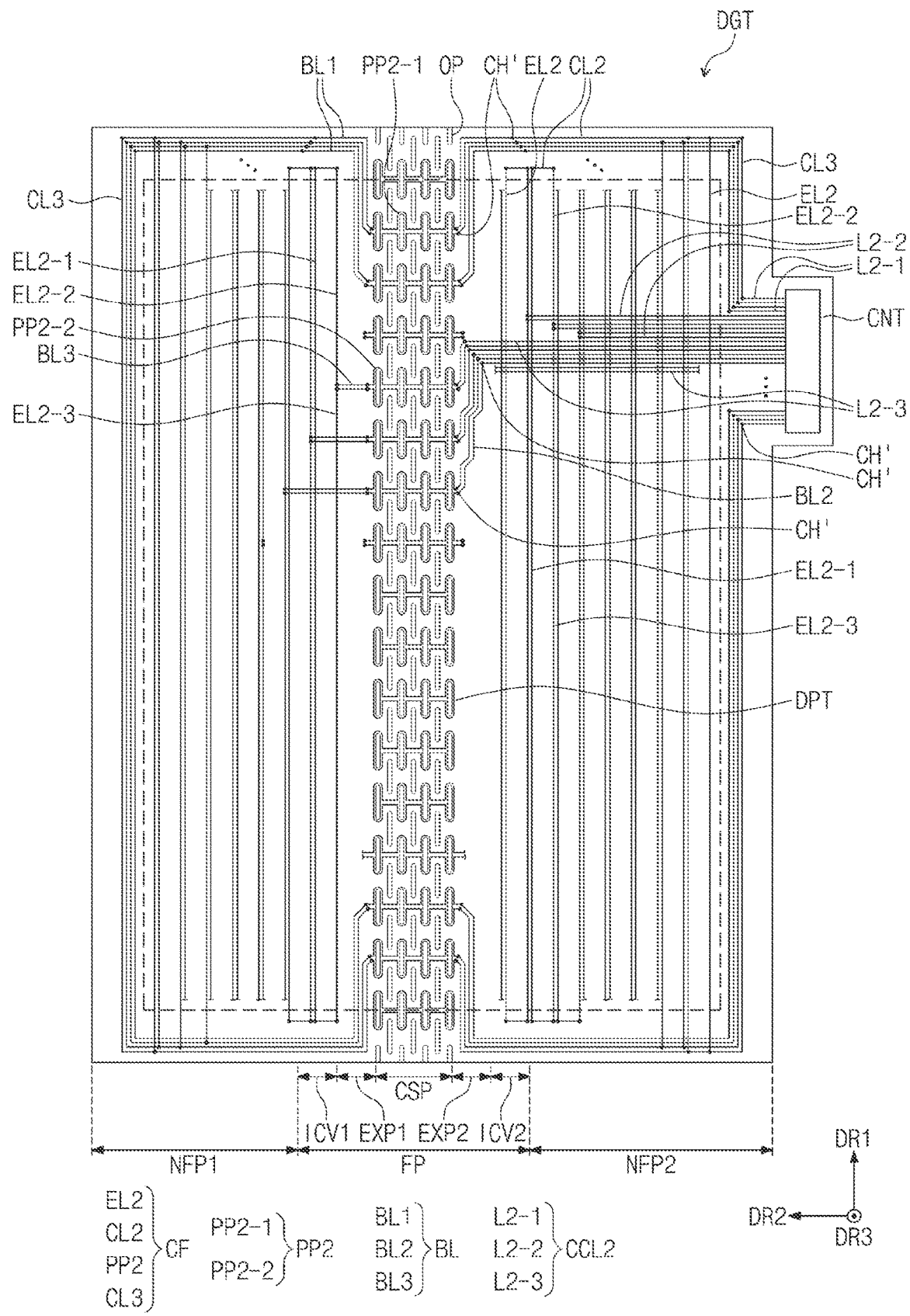
FIG. 13 is a plan view of the digitizer illustrating second sensing coils of the digitizer illustrated in FIG. 7.

FIG. 12 is a plan view of the digitizer illustrating first sensing coils of the digitizer illustrated in FIG. 7. FIG. 13 is a plan view of the digitizer illustrating second sensing coils of the digitizer illustrated in FIG. 7.

FIGS. 12 and 13 are plan views of the digitizer DGT as viewed from above the digitizer DGT, and the second non-folding portion NFP2 is illustrated as being disposed on the right side of the first non-folding portion NFP1.

Referring to FIG. 12, the region of the digitizer DGT on the plane may include an active region AA and a non-active region NAA around the active region AA. The non-active region NAA may surround the active region AA. The active region AA may overlap the above-described display region DA, and the non-active region NAA may overlap the above-described non-display region NDA.

The digitizer DGT may include a connector CNT, a plurality of first connector connecting lines CCL1, and a plurality of first sensing coils RF. The connector CNT may be disposed on one side of the digitizer DGT. For example, the connector CNT may be disposed in the right non-active region NAA. The connector CNT may be disposed on the second non-folding portion NFP2.

The first connector connecting lines CCL1 may be disposed in the right non-active region NAA. The first connector connecting lines CCL1 may extend in the second direction DR2 and may be arranged in the first direction DR1 and connected to the connector CNT. The first sensing coils RF may be connected to the first connector connecting lines CCL1. The first sensing coils RF may be connected to the connector CNT through the first connector connecting lines CCL1.

The first sensing coils RF may be disposed in the non-active region NAA and the active region AA. The first sensing coils RF may extend from the second non-folding portion NFP2 to the first non-folding portion NFP1. In the active region AA, the first sensing coils RF may extend through between the openings OP. For example, in the folding portion FP, the first sensing coils RF may extend through between the openings OP. For example, in the folding portion FP, the first sensing coils RF may curvedly extend along the peripheries of the openings OP.

The first sensing coils RF may extend from the connector CNT to form a loop shape together with the first connector connecting lines CCL1. For example, the first sensing coils RF extending from the connector CNT may extend from the right non-active region NAA to the left non-active region NAA via the active region AA and thereafter to the right non-active region NAA via the active region AA, and may be connected to the first connector connecting lines CCL1.

For example, some of the first sensing coils RF are illustrated in a loop shape, and the other first sensing coils RF are illustrated as extending only in the second direction DR2 in the active region AA without having a loop shape. However, this is illustrative, and the other first sensing coils RF may also extend in a loop shape.

Each of the first sensing coils RF may include a plurality of first extending lines EL1 and a plurality of first connecting lines CL1. The first extending lines EL1 may be disposed in the active region AA. The first extending lines EL1 may extend in the second direction DR2 and may be arranged in the first direction DR1. For example, each of the first sensing coils RF may include a pair of first extending lines EL1, and the pair of first extending lines EL1 may extend parallel to each other in the second direction DR2.

The first extending lines EL1 of the first sensing coils RF may be disposed adjacent to each other in pairs in the active region AA and may extend parallel to each other in the second direction DR2. The first extending lines EL1 may extend through between the openings OP. In the folding portion FP, the first extending lines EL1 may curvedly extend along the peripheries of the openings OP.

The first extending lines EL1 may have a different length from the first connecting lines CL1. For example, the first extending lines EL1 may be longer than the first connecting lines CL1. However, embodiments of the present disclosure are not limited thereto.

The first connecting lines CL1 may be disposed in the non-active region NAA and may extend in the first direction DR1. For example, the first connecting lines CL1 may be disposed in the left and right non-active regions NAA. The first connecting lines CL1 may be connected to the first extending lines EL1. For example, the first connecting lines CL1 of each of the first sensing coils RF may be connected to opposite ends of the first extending lines EL1 of the first sensing coil RF.

The first extending lines EL1 may be disposed in a layer different from the layer in which the first connecting lines CL1 are disposed. For example, the first connecting lines CL1 may be disposed below the first extending lines EL1. The first connecting lines CL1 may be connected to the first extending lines EL1 through contact holes CH. This stacked configuration will be described below in detail with reference to FIG. 25.

The first connector connecting lines CCL1 may be connected to the first connecting lines CL1 disposed in the right non-active region NAA. The first connector connecting lines CCL1 may be disposed in the same layer as the first extending lines EL1 and may be disposed in a different layer from the first connecting lines CL1. The first connecting lines CL1 may be disposed below the first connector connecting lines CCL1. The first connecting lines CL1 may be connected to the first connector connecting lines CCL1 through the contact holes CH.

Each of the first extending lines EL1 may include first extensions EX1 disposed in the first and second non-folding portions NFP1 and NFP2, respectively, and a first pattern portion PP1 disposed in the curved surface portion CSP of the folding portion FP. The first extensions EX1 may extend in the second direction DR2 in the first and second non-folding portions NFP1 and NFP2. The first extensions EX1 may extend to the first and second inverse curvature portions ICV1 and ICV2 and the first and second extensions EXP1 and EXP2.

The first pattern portion PP1 may extend through between the openings OP. In the folding portion FP, the first pattern portion PP1 may curvedly extend along the peripheries of the openings OP. The first pattern portion PP1 may extend from the first extensions EX1. That is, in an embodiment of the present disclosure, the first pattern portion PP1 may be integrally formed with the first extensions EX1.

Referring to FIGS. 12 and 13, the digitizer DGT may include a plurality of second sensing coils CF, a plurality of bridge lines BL, and a plurality of second connector connecting lines CCL2.

The second sensing coils CF may be connected to the second connector connecting lines CCL2, and the second connector connecting lines CCL2 may be connected to the connector CNT. The second sensing coils CF may be connected to the connector CNT through the second connector connecting lines CCL2. The bridge lines BL may be connected to the second sensing coils CF. The second sensing coils CF may extend from the connector CNT to form a loop shape together with the second connector connecting lines CCL2.

For example, some of the second sensing coils CF are illustrated in a loop shape, and the other second sensing coils CF are illustrated as extending in the first direction DR1 in the active region AA without having a loop shape. However, this is illustrative, and the other second sensing coils CF may also extend in a loop shape.

The bridge lines BL may be disposed below the second sensing coils CF. The bridge lines BL may include a plurality of first bridge lines BL1, a plurality of second bridge lines BL2, and a plurality of third bridge lines BL3. In FIG. 13, for convenience of illustration, some of the first bridge lines BL1, some of the second bridge lines BL2, and some of the third bridge lines BL3 are omitted.

The first bridge lines BL1 may be adjacent to the upper side and the lower side of the digitizer DGT. The second bridge lines BL2 and the third bridge lines BL3 may be disposed between the first bridge lines BL1 adjacent to the upper side of the digitizer DGT and the first bridge lines BL1 adjacent to the lower side of the digitizer DGT.

The first bridge lines BL1 may be adjacent to the openings OP. The first bridge lines BL1 may be disposed between the first non-folding region NFP1 and the curved surface portion CSP and between the second non-folding region NFP2 and the curved surface portion CSP.

The second and third bridge lines BL2 and BL3 may be adjacent to the openings OP. The second bridge lines BL2 may be disposed between the second non-folding region NFP2 and the curved surface portion CSP. The third bridge lines BL3 may be disposed between the first non-folding region NFP1 and the curved surface portion CSP. Some of the third bridge lines BL3 may extend to the first non-folding region NFP1.

The second sensing coils CF may include a plurality of second extending lines EL2, a plurality of second connecting lines CL2, a plurality of second pattern portions PP2, and a plurality of third connecting lines CL3.

The second extending lines EL2 may be disposed in the active region AA. The second extending lines EL2 may extend in the first direction DR1 and may be arranged in the second direction DR2. The second extending lines EL2 may be disposed in the first and second non-folding portions NFP1 and NFP2. The second extending lines EL2 may be disposed in the first and second extensions EXP1 and EXP2 and the first and second inverse curvature portions ICV1 and ICV2. In the active region AA, the second extending lines EL2 may be disposed adjacent to each other in pairs and may extend parallel to each other in the first direction DR1.

The second extending lines EL2 may be disposed below the first extending lines EL1. That is, in the active region AA, the second sensing coils CF may be disposed below the first sensing coils RF. The second extending lines EL2 may be disposed in the same layer as the first connecting lines CL1.

The second connecting lines CL2 may be disposed in the non-active region NAA and may extend in the second direction DR2. For example, the second connecting lines CL2 may be disposed in the upper and lower non-active regions NAA. The second connecting lines CL2 may be disposed in the same layer as the first extending lines EL1.

The second connecting lines CL2 may be connected to opposite ends of the second extending lines EL2 through contact holes CH'. Some of the second connecting lines CL2 may be connected to the first bridge lines BL1 through the contact holes CH'.

The second pattern portions PP2 may be disposed in the curved surface portion CSP of the folding portion FP. The second pattern portions PP2 may extend through between the openings OP. The second pattern portions PP2 may curvedly extend along the peripheries of the openings OP. The second pattern portions PP2 may be connected to the first, second, and third bridge lines BL1, BL2, and BL3 through the contact holes CH'. The second pattern portions PP2 may be disposed in the same layer as the second extending lines EL2. The second pattern portions PP2 may be disposed below the first pattern portions PPL.

The second pattern portions PP2 may include second-first pattern portions PP2-1 connected to the first bridge lines BL1 and second-second pattern portions PP2-2 connected to the second and third bridge lines BL2 and BL3. Some second connecting lines CL2 disposed in the first non-folding portion NFP1 and some second connecting lines CL2 disposed in the second non-folding portion NFP2 may be connected to each other through the first bridge lines BL1 and the second-first pattern portions PP2-1.

The second connector connecting lines CCL2 may be connected to the connector CNT and may extend in the second direction DR2. The second connector connecting lines CCL2 may be disposed in the same layer as the above-described first extending lines EL1. Some of the second connector connecting lines CCL2 may be connected to the second connecting lines CL2, and other second connector connecting lines CCL2 may extend to the active region AA and may be connected to some of the second extending lines EL2.

The second connector connecting lines CCL2 may include a plurality of second-first lines L2-1, a plurality of second-second lines L2-2, and a plurality of second-third lines L2-3. The second-first lines L2-1 may be disposed in the right non-active region NAA. The second-first lines L2-1 may be connected to the third connecting lines CL3 through the contact holes CH'. The second-first lines L2-1 may be connected to the second connecting lines CL2 through the third connecting lines CL3.

The second-second lines L2-2 may be disposed in the second non-folding region NFP2. The second-second lines L2-2 may extend to the active region AA and may be connected to some of the second extending lines EL2 through the contact holes CH'. The second-second lines L2-2 may be connected to some second extending lines EL2 disposed in the active region AA. The second-second lines L2-2 may be connected to the second extending lines EL2 to form a loop shape together with the second extending lines EL2.

Some of the second extending lines EL2 may each include a second-first extending line EL2-1, a second-second extending line EL2-2, and a second-third extending line EL2-3. The second-first extending line EL2-1 may extend in the first direction DR1 and may be connected to first ends of a corresponding pair of second connecting lines CL2 through the contact holes CH'.

The second-second extending line EL2-2 and the second-third extending line EL2-3 may extend in the first direction DR1 and may be connected to second ends of a corresponding pair of second connecting lines CL2 through the contact holes CH'. In the active region AA, the second-second extending line EL2-2 and the second-third extending line EL2-3 may be connected to a corresponding pair of second-second lines L2-2 through the contact holes CH'.

The second-third lines L2-3 may be disposed in the second non-folding region NFP2. The second-third lines L2-3 may extend to the active region AA. In the active region AA, the second-third lines L2-3 may be connected to the second bridge lines BL2 through the contact holes CH'. The second bridge lines BL2 may be connected to the second-second pattern portions PP2-2 through the contact holes CH'. A pair of second-third lines L2-3 may be connected to a corresponding pair of second bridge lines BL2.

The second-second pattern portions PP2-2 may be connected, through the contact holes CH', to some second extending lines EL2 disposed in the first non-folding region NFP1. For example, the second-second extending line EL2-2 and the second-third extending line EL2-3 of each of some second extending lines EL2 disposed in the first non-folding region NFP1 may be connected to a corresponding pair of second-second pattern portions PP2-2.

A pair of second-second pattern portions PP2-2 may be connected to the second-second extending line EL2-2 and the second-third extending line EL2-3 through a corresponding pair of third bridge lines BL3. For example, the third bridge lines BL3 may be disposed between the second-second pattern portions PP2-2 and ends of the extending second-second lines EL2-2 and 2-3 EL2-3.

The second-second pattern portions PP2-2 may be connected to the third bridge lines BL3 through the contact holes CH'. The third bridge lines BL3 may be connected to the second-second extending line EL2-2 and the second-third extending line EL2-3 through the contact holes CH'.

Accordingly, each of some second extending lines EL2 disposed in the first non-folding region NFP1 may be connected to a corresponding pair of second bridge lines BL2 through a corresponding pair of third bridge lines BL3 and a corresponding pair of second-second pattern portions PP2-2. According to this connection, the second extending lines EL2, the third bridge lines BL3, the second-second pattern portions PP2-2, the second bridge lines BL2, and the second-third lines L2-3 may be connected to form a loop shape.

A plurality of dummy pattern portions DPT may be disposed between the openings OP where the second pattern portions PP2 are not disposed. The dummy pattern portions DPT may be insulated from neighboring conductors and may be in a floating state.

The third connecting lines CL3 may be disposed in the non-active region NAA and may extend in the first direction DR1. The third connecting lines CL3 may be disposed in the left and right non-active regions NAA.

The third connecting lines CL3 disposed in the right non-active region NAA may be connected, through the contact holes CH', to the second connecting lines CL2 and the second-first lines L2-1 disposed in the second non-folding portion NFP2. The third connecting lines CL3 disposed in the left non-active region NAA may be connected, through the contact holes CH', to the second connecting lines CL2 disposed in the first non-folding portion NFP1.

According to the above-described structure, the second sensing coils CF may extend from the connector CNT to have a coil shape.

In an embodiment of the present disclosure, the second sensing coils CF may be defined as driving coils, and the first sensing coils RF may be defined as sensing coils. However, the present disclosure is not limited thereto. In contrast, in an embodiment, the second sensing coils CF may be defined as sensing coils, and the first sensing coils RF may be defined as driving coils. When electric current flows through the second sensing coils CF, lines of magnetic force may be induced between the second sensing coils CF and the first sensing coils RF. The first sensing coils RF may sense an induced electromagnetic force emitted from the electromagnetic pen and may output the sensed induced electromagnetic force to terminals of the first sensing coils RF as a sensing signal.

Figure 17:
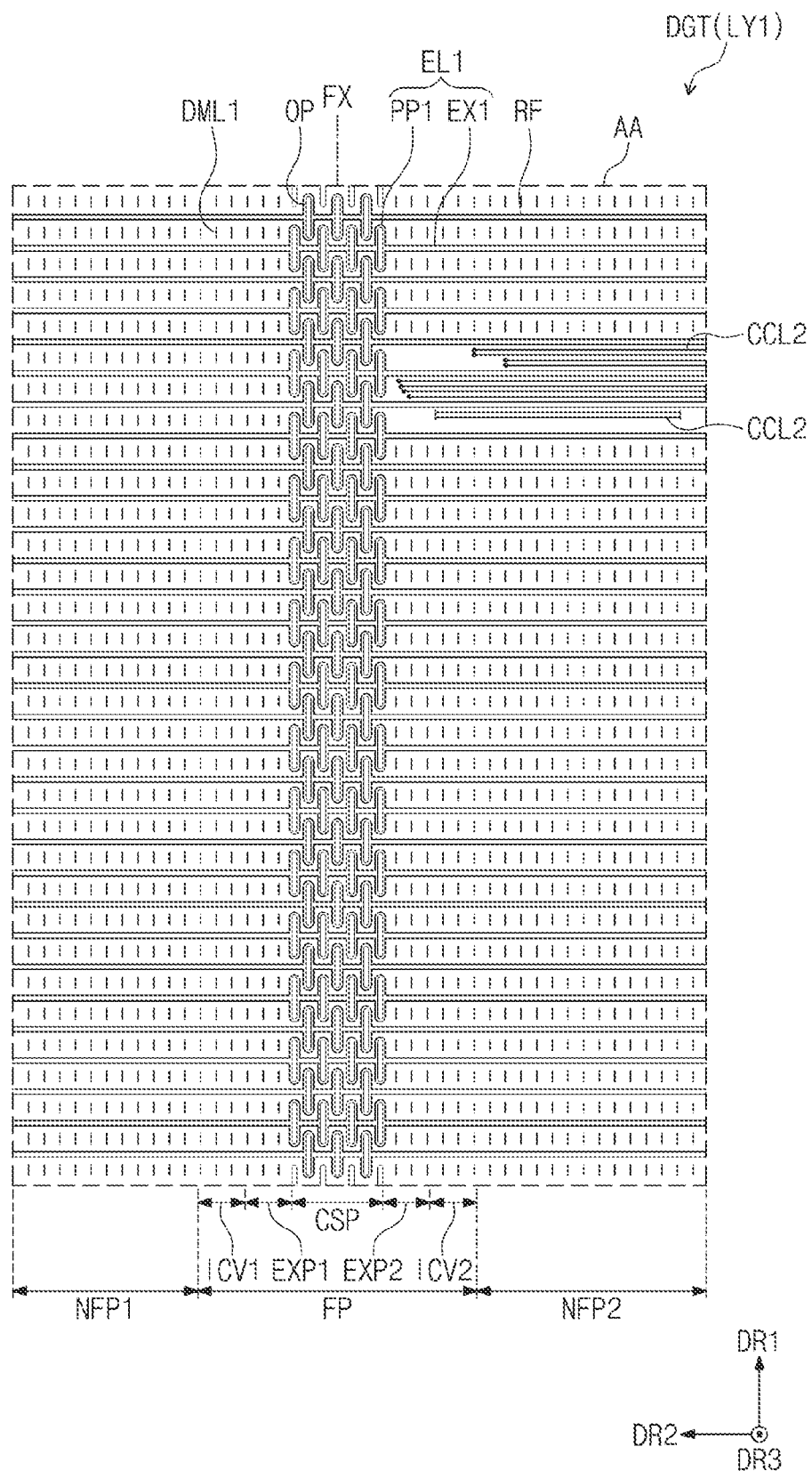
FIGS. 17 to 19 are views illustrating sequential layer configurations of the digitizer illustrated in FIGS. 12 and 13.
Figure 18:
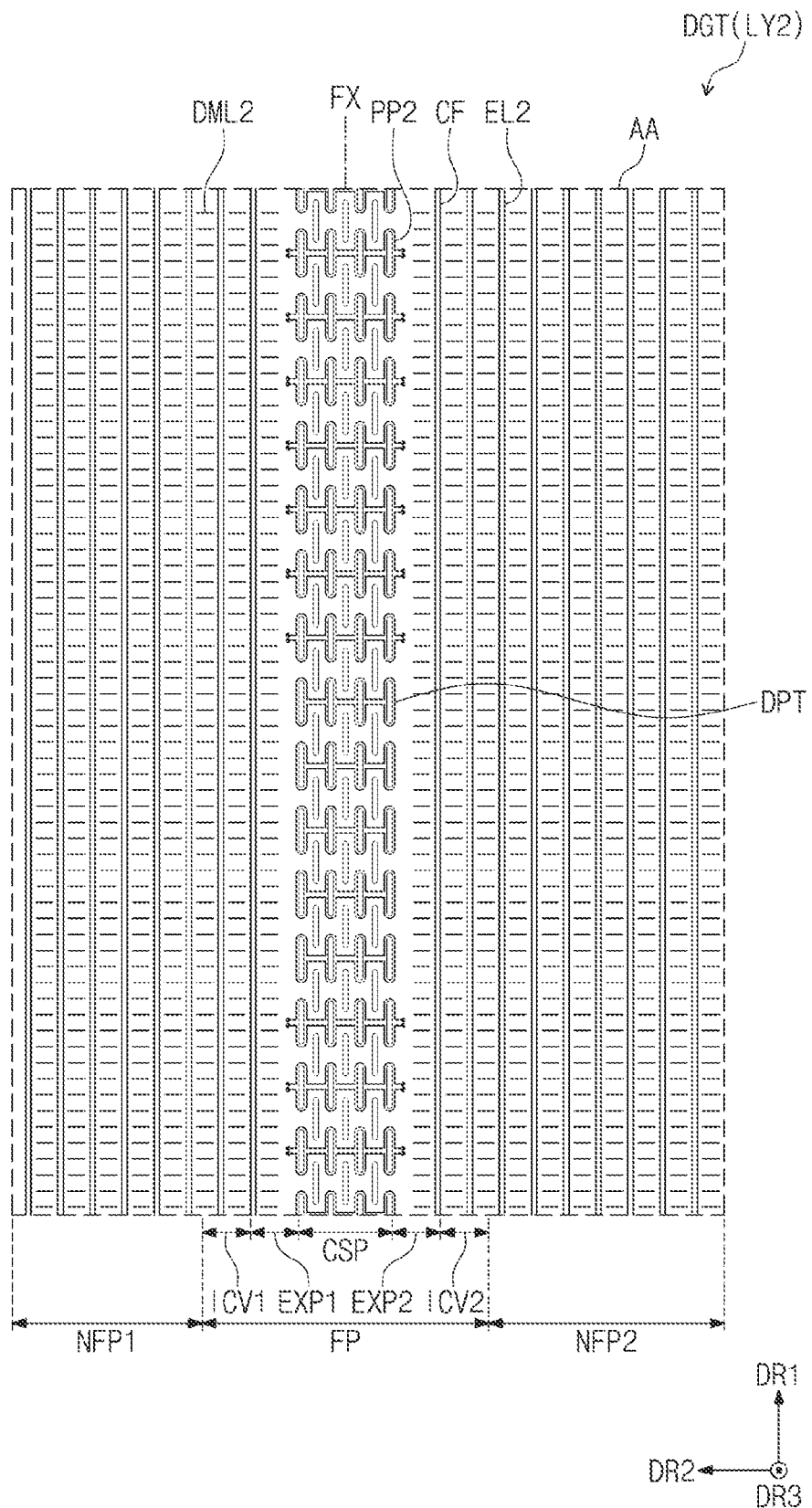
Figure 19:
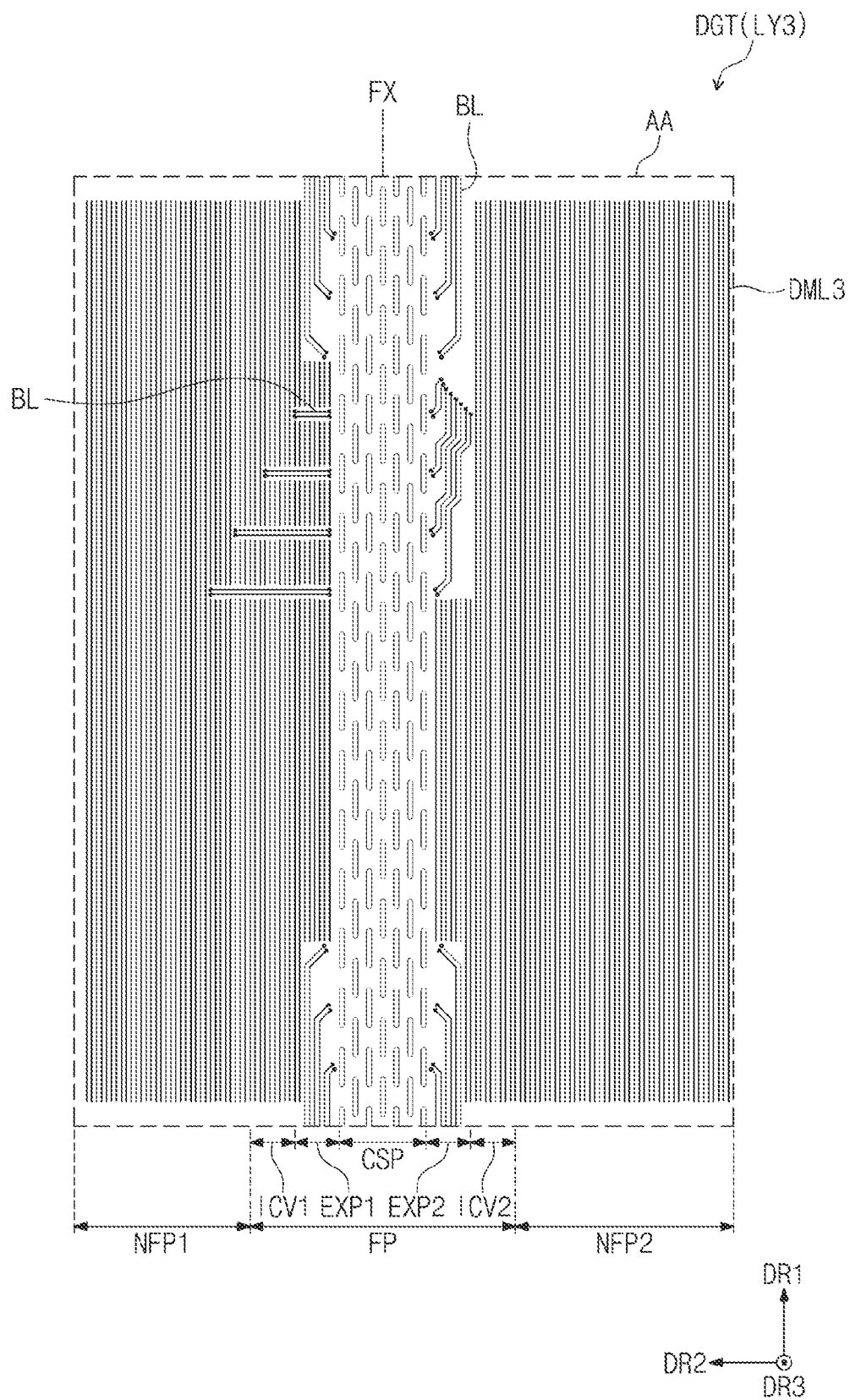

According to embodiments, the digitizer DGT may include a plurality of dummy lines, which are illustrated in FIGS. 17 to 19.

Figure 14:
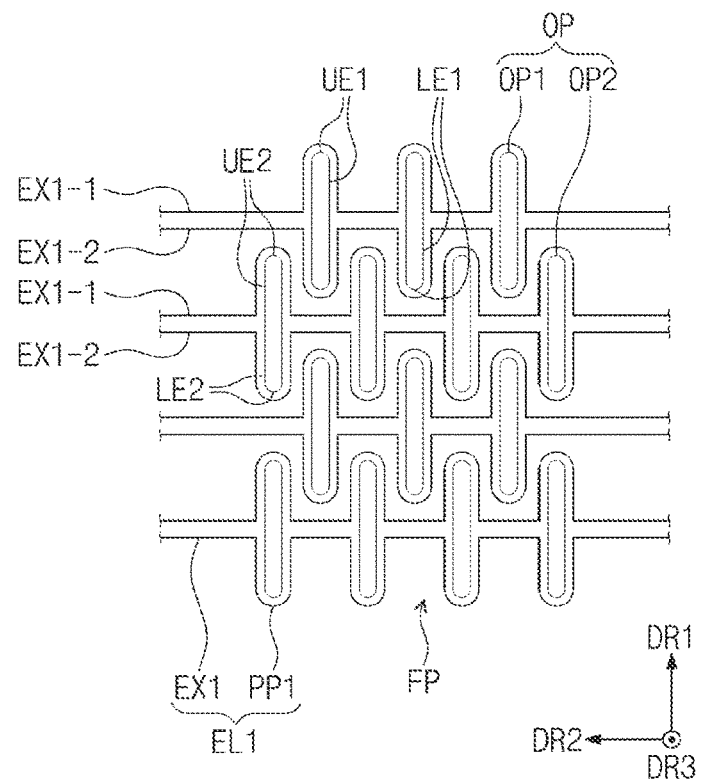
FIG. 14 is an enlarged view of part of a folding portion illustrated in FIG. 12.

FIG. 14 is an enlarged view of part of the folding portion illustrated in FIG. 12.

Referring to FIG. 14, the openings OP may include first openings OP1 arranged in a $k^{th}$ row and second openings OP2 arranged in a $(k+1)^{th}$ row, where k is a positive integer. The first openings OP1 and the second openings OP2 may be staggered with respect to each other. The rows may extend in the second direction DR2.

For example, based on the second direction DR2, the number of first openings Op1 may be smaller than the number of second openings OP2. However, embodiments of the present disclosure are not limited thereto.

The first extending lines EL1 may extend through between the first openings OP1 and the second openings OP2. The first extending lines EL1 may extend along the peripheries of the first openings OP1 and the peripheries of the second openings OP2.

The first extending lines EL1 may curvedly extend to have a shape corresponding to the peripheries of the first openings OP1 and the peripheries of the second openings OP2. For example, between the first openings OP1 and the second openings OP2, the first pattern portions PP1 may curvedly extend to have a shape corresponding to the peripheries of the first openings OP1 and the peripheries of the second openings OP2.

The first extending lines EL1 may extend along an upper periphery UE1 and a lower periphery LE1 of each of the first openings OP1 so as to be adjacent to the upper periphery UE1 and the lower periphery LE1. Furthermore, the first extending lines EL1 may extend along an upper periphery UE2 and a lower periphery LE2 of each of the second openings OP2 so as to be adjacent to the upper periphery UE2 and the lower periphery LE2.

In an embodiment of the present disclosure, the upper peripheries UE1 and UE2, when viewed on the plane, may be defined as peripheries of portions of the openings OP that are formed above the centers of the openings OP based on the first direction DR1. Furthermore, the lower peripheries LE1 and LE2, when viewed on the plane, may be defined as peripheries of portions of the openings OP that are formed below the centers of the openings OP based on the first direction DR1.

Among the first extending lines EL1, a pair of first extending lines EL1 adjacent to each other may be defined as a first-first extending line EX1-1 and a first-second extending line EX1-2. In the folding portion FP, each of the first-first extending lines EX1-1 may extend along the upper peripheries UE1 of the first openings OP1 and the upper peripheries UE2 of the second openings OP2. In the folding portion FP, each of the first-second extending lines EX1-2 may extend along the lower peripheries LE1 of the first openings OP1 and the lower peripheries LE2 of the second openings OP2.

Accordingly, the first pattern portions PP1 may extend along the upper periphery UE1 and the lower periphery LE1 of each of the first openings OP1 so as to be adjacent to the upper periphery UE1 and the lower periphery LE1. Furthermore, the first pattern portions PP1 may extend along the upper periphery UE2 and the lower periphery LE2 of each of the second openings OP2 so as to be adjacent to the upper periphery UE2 and the lower periphery LE2.

Figure 15:
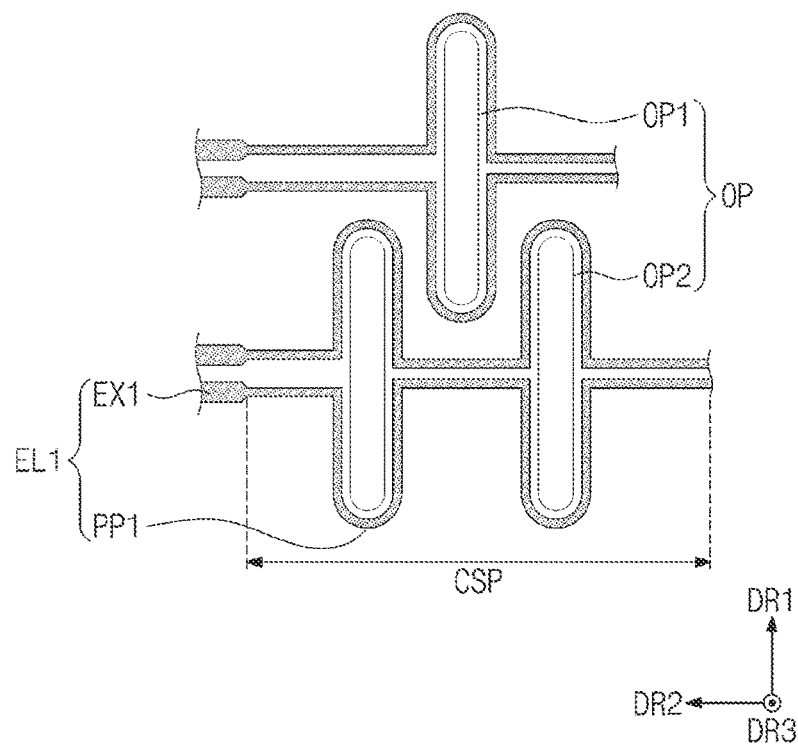
FIG. 15 is an enlarged view of some of the first extending lines illustrated in FIG. 14.

FIG. 15 is an enlarged view of some of the first extending lines illustrated in FIG. 14.

Referring to FIG. 15, the widths of the first extensions EX1 may be greater than the widths of the first pattern portions PP1 disposed in the curved surface portion CSP. Since the areas between the openings OP are limited, the widths of the first extending lines EL1 may be small between the openings OP such that the first extending lines EL1 pass between the openings OP.

In an embodiment of the present disclosure, the widths may be defined as values measured in a direction perpendicular to the extension direction of the lines. For example, the first pattern portions PP1 may have a width of about 40 micrometers to about 80 micrometers.

Figure 16:
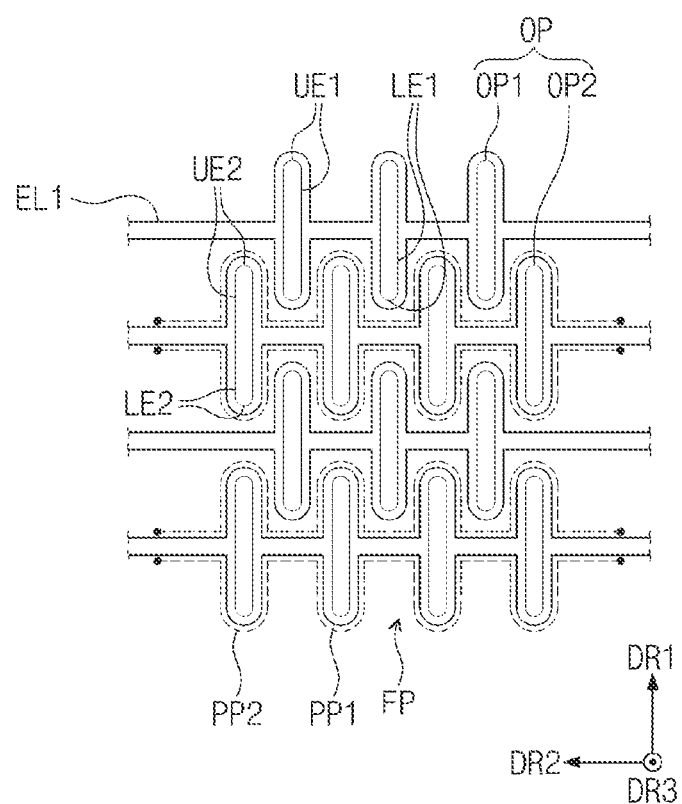
FIG. 16 is a view in which second pattern portions illustrated in FIG. 13 are additionally illustrated in FIG. 14.

FIG. 16 is a view in which the second pattern portions illustrated in FIG. 13 are additionally illustrated in FIG. 14.

In FIG. 16, the second pattern portions PP2 are illustrated by dotted lines.

Referring to FIG. 16, the second pattern portions PP2 may extend along the upper periphery UE2 and the lower periphery LE2 of each of the second openings OP2 so as to be adjacent to the upper periphery UE2 and the lower periphery LE2. In an embodiment, the second pattern portions PP2 do not extend along the upper periphery UE1 and the lower periphery LE1 of each of the first openings OP1. That is, in an embodiment, the second pattern portions PP2 are not disposed around the upper periphery UE1 and the lower periphery LE1.

In an embodiment, the second pattern portions PP2 are not disposed below the first pattern portions PP1 extending along the peripheries of the first openings OP1 among the first pattern portions PP1. The second pattern portions PP2 may be disposed below the first pattern portions PP1 extending along the peripheries of the second openings OP2 among the first pattern portions PP1.

For example, the second pattern portions PP2 are illustrated as being spaced apart from the first pattern portions PP1 so as to be distinguished from the first pattern portions PP1. However, when viewed on the plane, the second pattern portions PP2 may be disposed to overlap the first pattern portions PP1 extending along the peripheries of the second openings OP2.

FIGS. 17 to 19 are views illustrating sequential layer configurations of the digitizer illustrated in FIGS. 12 and 13.

In FIGS. 17 to 19, the active region AA is illustrated. Layers illustrated in FIGS. 17 to 19 are stacked from top to bottom. Hereinafter, the layers illustrated in FIGS. 17 to 19 are defined as first, second, and third layers LY1, LY2, and LY3, respectively.

Referring to FIGS. 17 to 19, the digitizer DGT may include the first, second, and third layers LY1, LY2, and LY3. The lines illustrated in FIGS. 12 and 13 may be disposed in the first, second, and third layers LY1, LY2, and LY3.

Referring to FIG. 17, the first extending lines EL1 of the first sensing coils RF may be disposed in the first layer LY1, that is, the top layer in the active region AA. The second connector connecting lines CCL2 may also be disposed in the first layer LY1.

The digitizer DGT may include first dummy lines DML1 disposed in the first layer LY1. Thus, the first dummy lines DML1 may be disposed in the same layer as the first extending lines EL1 of the first sensing coils RF.

The first dummy lines DML1 may extend in the first direction DR1 and may be arranged in the second direction DR2. For example, the first dummy lines DML1 may extend lengthwise in the first direction DR1. The first dummy lines DML1 may extend parallel to the folding axis FX. That is, both the first dummy lines DML1 and the folding axis FX may extend in the first direction DR1. The first dummy lines DML1 may be disposed between the first extending lines EL1 of the first sensing coils RF. For example, the first dummy lines DML1 may be disposed between adjacent first extending lines EL1 of the first sensing coils RF.

According to embodiments, the first dummy lines DML1 do not overlap the curved surface portion CSP when viewed on the plane. That is, according to embodiments, the first dummy lines DML1 are not disposed in the curved surface portion CSP. The first dummy lines DML1 may overlap the first and second inverse curvature portions ICV1 and ICV2 and the first and second non-folding portions NFP1 and NFP2 when viewed on the plane.

Referring to FIGS. 17 and 18, the second layer LY2 may be disposed under the first layer LY1. The second extending lines EL2 of the second sensing coils CF may be disposed in the second layer LY2. Furthermore, the second pattern portions PP2 and the dummy pattern portions DPT may be disposed in the second layer LY2.

In the active region AA, the second extending lines EL2, the second pattern portions PP2, and the dummy pattern portions DPT of the second sensing coils CF, which are disposed in the second layer LY2, may be disposed below the first extending lines EL1 of the first sensing coils RF, which are disposed in the first layer LY1.

The digitizer DGT may include second dummy lines DML2 disposed in the second layer LY2. The second dummy lines DML2 may be disposed in the same layer as the second extending lines EL2 of the second sensing coils CF. That is, both the second dummy lines DML2 and the second extending lines EL2 of the second sensing coils CF may be disposed in the second layer LY2.

Unlike the first dummy lines DML1 disposed in the first layer LY1, which extend in the first direction DR1 and are arranged in the second direction DR2, the second dummy lines DML2 disposed in the second layer LY2 may extend in the second direction DR2 and may be arranged in the first direction DR1. For example, the second dummy lines DML2 may extend lengthwise in the second direction DR2. Thus, the second dummy lines DML2 may extend in a direction crossing the folding axis FX. The second dummy lines DML2 may be disposed between the second extending lines EL2 of the second sensing coils CF. For example, the second dummy lines DML2 may be disposed between adjacent second extending lines EL2 of the second sensing coils CF.

According to embodiments, the second dummy lines DML2 do not overlap the curved surface portion CSP when viewed on the plane. That is, according to embodiments, the second dummy lines DML2 are not disposed in the curved surface portion CSP. The second dummy lines DML2 may overlap the first and second inverse curvature portions ICV1 and ICV2 and the first and second non-folding portions NFP1 and NFP2 when viewed on the plane.

Referring to FIGS. 17, 18, and 19, the third layer LY3 may be disposed under the second layer LY2. The bridge lines BL may be disposed in the third layer LY3. In the active region AA, the bridge lines BL, which are disposed in the third layer LY3, may be disposed below the second extending lines EL2, the second pattern portions PP2, and the dummy pattern portions DPT of the second sensing coils CF, which are disposed in the second layer LY2.

The digitizer DGT may include third dummy lines DML3 disposed in the third layer LY3. The third dummy lines DML3 may be disposed in the same layer as the bridge lines BL. That is, both the third dummy lines DML3 and the bridge lines BL may be disposed in the third layer LY3.

The third dummy lines DML3 may extend in the first direction DR1 and may be arranged in the second direction DR2. For example, the third dummy lines DML3 may extend lengthwise in the first direction DR1. The third dummy lines DML3 may extend parallel to the folding axis FX. The third dummy lines DML3 may be disposed around the bridge lines BL and between the bridge lines BL.

According to embodiments, the third dummy lines DML3 do not overlap the curved surface portion CSP when viewed on the plane. That is, according to embodiments, the third dummy lines DML3 are not disposed in the curved surface portion CSP. The third dummy lines DML3 may overlap the first and second inverse curvature portions ICV1 and ICV2 and the first and second non-folding portions NFP1 and NFP2 when viewed on the plane.

The first, second, and third dummy lines DML1, DML2, and DML3 may be separated from the first and second sensing coils RF and CF and the bridge lines BL, and may be in a floating state.

In an embodiment of the present disclosure, at least two types of dummy lines among the first, second, and third dummy lines DML1, DML2, and DML3 may extend in the same direction. For example, the first and third dummy lines DML1 and DML3 may extend in the first direction DR1. The second dummy lines DML2 may extend in a direction different from that of the first and third dummy lines DML1 and DML3. For example, the second dummy lines DML2 may extend in the second direction DR2.

However, embodiments of the present disclosure are not limited thereto. For example, the first and second dummy lines DML1 and DML2 may extend in the first direction DR1, and the third dummy lines DML3 may extend in the second direction DR2. Alternatively, the second and third dummy lines DML2 and DML3 may extend in the first direction DR1, and the first dummy lines DML1 may extend in the second direction DR2.

Referring to a comparative example, the first, second, and third dummy lines DML1, DML2, and DML3 may not be disposed in the digitizer DGT. In this case, the first sensing coils RF spaced apart from each other by a predetermined gap and the second sensing coils CF spaced apart from each other by a predetermined gap may be visible from the outside (e.g., visible to a user). Since separate lines are not disposed in regions around the bridge lines BL, the bridge lines BL may also be visible from the outside (e.g., visible to a user).

However, in embodiments of the present disclosure, the first, second, and third dummy lines DML1, DML2, and DML3 may be disposed between the first sensing coils RF, between the second sensing coils CF, and around the bridge lines BL. In this case, according to embodiments of the present disclosure, the first sensing coils RF, the second sensing coils CF, and the bridge lines BL are not visible from the outside (e.g., are not visible to a user).

For example, in a case in which two first structures are spaced far apart from each other and an empty space is formed between the two first structures, the two first structures may be easily visually recognized from the outside (e.g., may be easily visually recognized to a user). As the empty space is increased, the sparsely arranged structures may be easily visually recognized from the outside (e.g., may be easily visually recognized to a user). However, in a case in which the empty space between the two first structures is filled with a plurality of second structures, the plurality of first and second structures may be disposed adjacent to each other, and therefore, the empty space may be reduced. In this case, according to embodiments, the two first structures spaced apart from each other are not visible from the outside (e.g., are not visible to a user).

Figure 20:
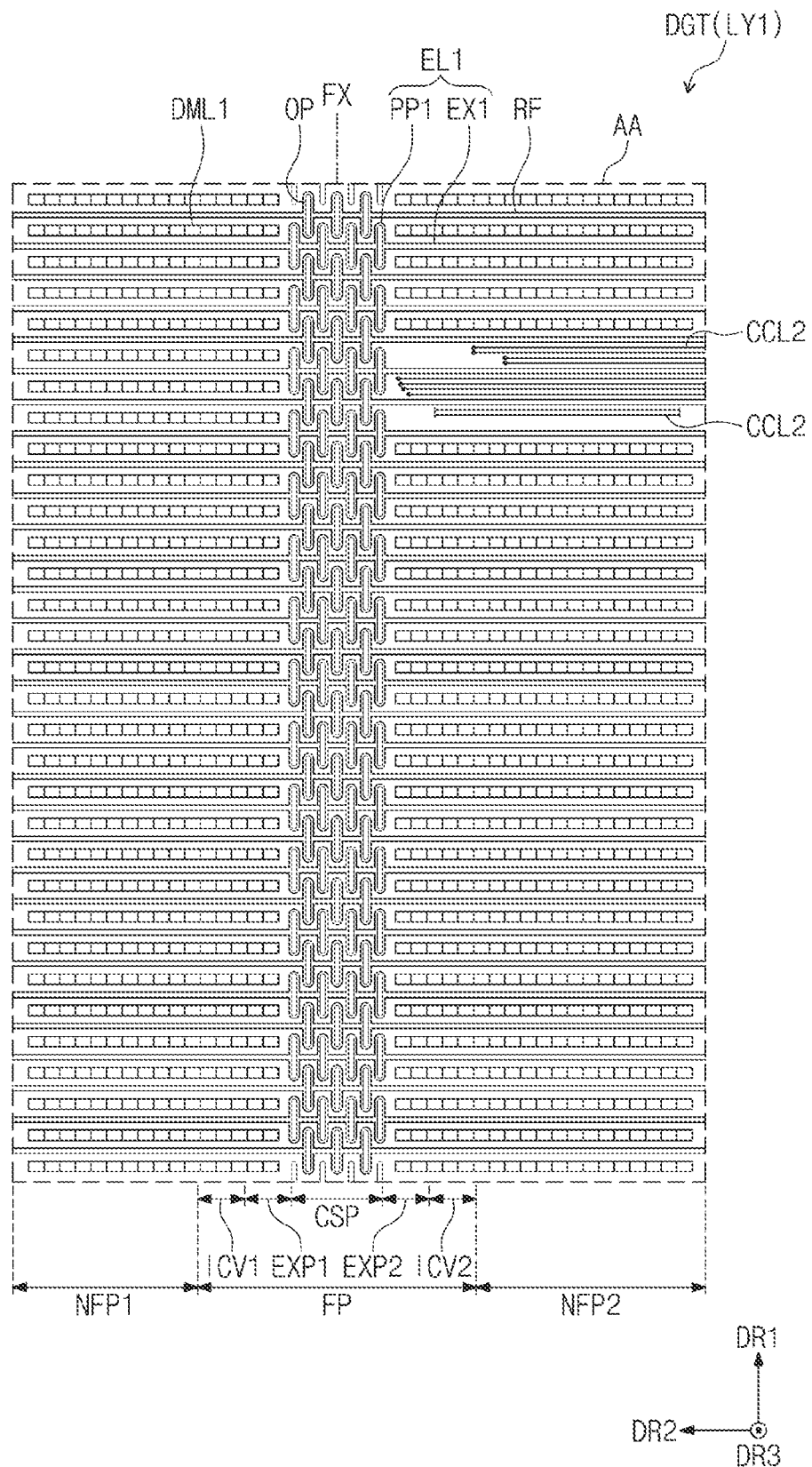
FIG. 20 is a view illustrating an embodiment of first dummy lines illustrated in FIG. 17.
Figure 21:
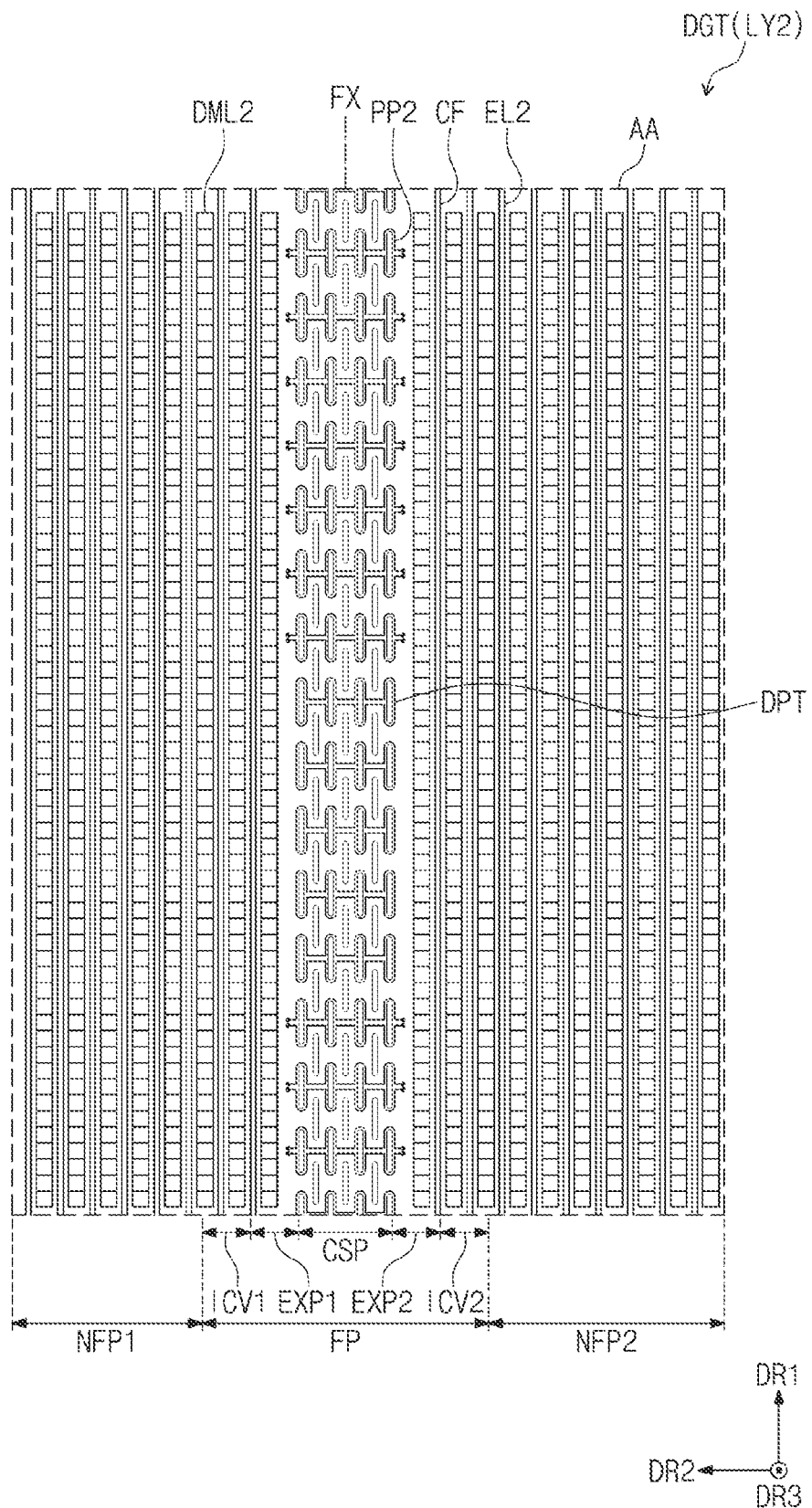
FIG. 21 is a view illustrating an embodiment of second dummy lines illustrated in FIG. 18.

FIG. 20 is a view illustrating an embodiment of the first dummy lines illustrated in FIG. 17. FIG. 21 is a view illustrating an embodiment of the second dummy lines illustrated in FIG. 18.

Referring to FIG. 20, the first dummy lines DML1 may be connected to each other. For example, upper ends of some of the first dummy lines DML1 may be connected to each other, and lower ends of the some of the first dummy lines DML1 may be connected to each other.

Referring to FIG. 21, the second dummy lines DML2 may be connected to each other. For example, first sides of some of the second dummy lines DML2 may be connected to each other, and second sides of the some of the second dummy lines DML2 may be connected to each other.

According to embodiments, the third dummy lines DML3 may also be connected to each other similarly to the first and second dummy lines DML1 and DML2.

Figure 22:
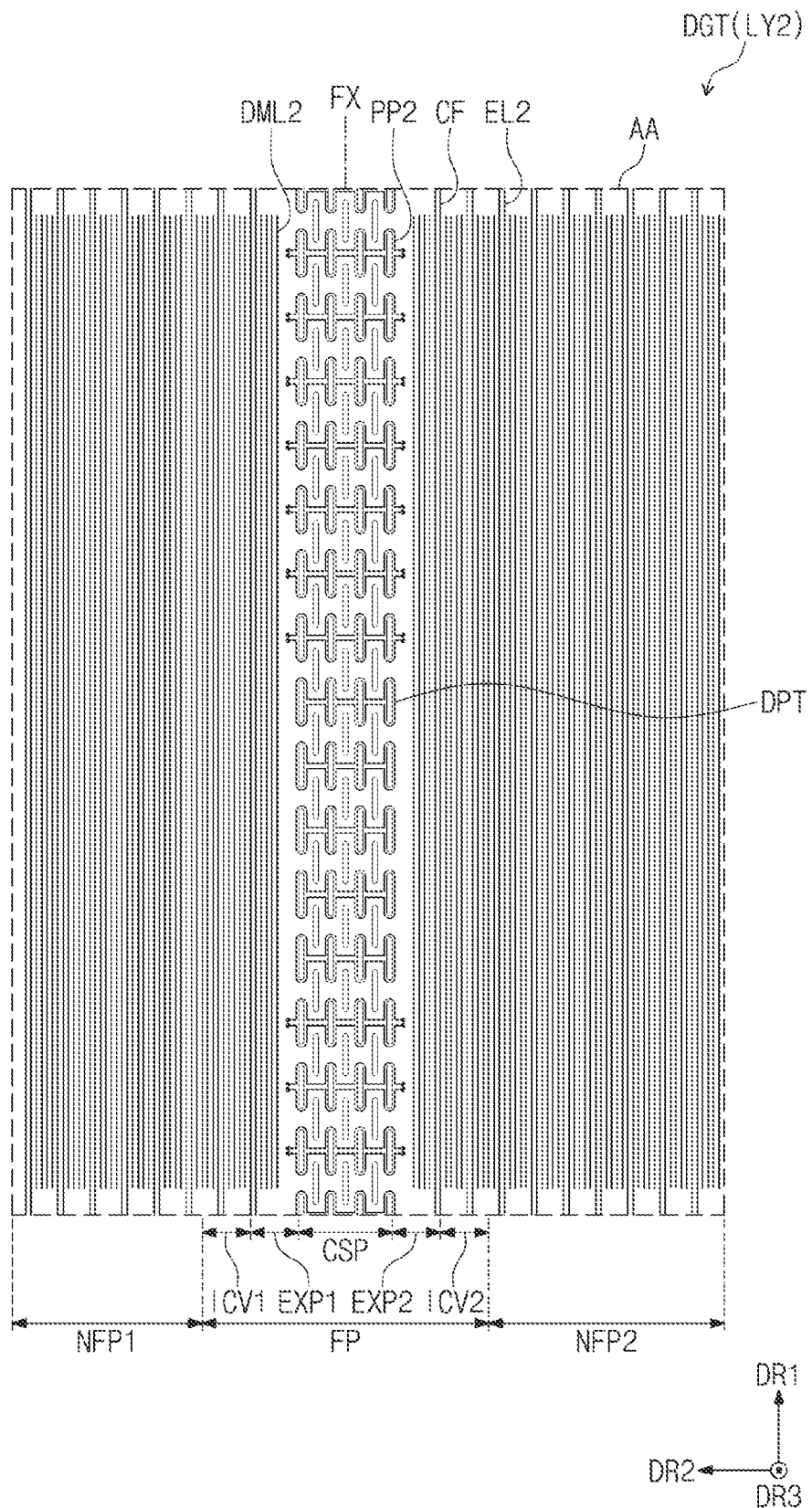
FIG. 22 is a view illustrating an embodiment of the second dummy lines illustrated in FIG. 18.

FIG. 22 is a view illustrating an embodiment of the second dummy lines illustrated in FIG. 18.

Referring to FIGS. 17, 19, and 22, second dummy lines DML2 may extend in the first direction DR1 (e.g., extend lengthwise in the first direction DR1) and may be arranged in the second direction DR2. The second dummy lines DML2 may be disposed between the second extending lines EL2.

The first, second, and third dummy lines DML1, DML2, and DML3 may extend in the same direction. For example, the first, second, and third dummy lines DML1, DML2, and DML3 may extend in the first direction DR1 (e.g. may extend lengthwise in the first direction DR1) parallel to the folding axis FX.

Figure 23:
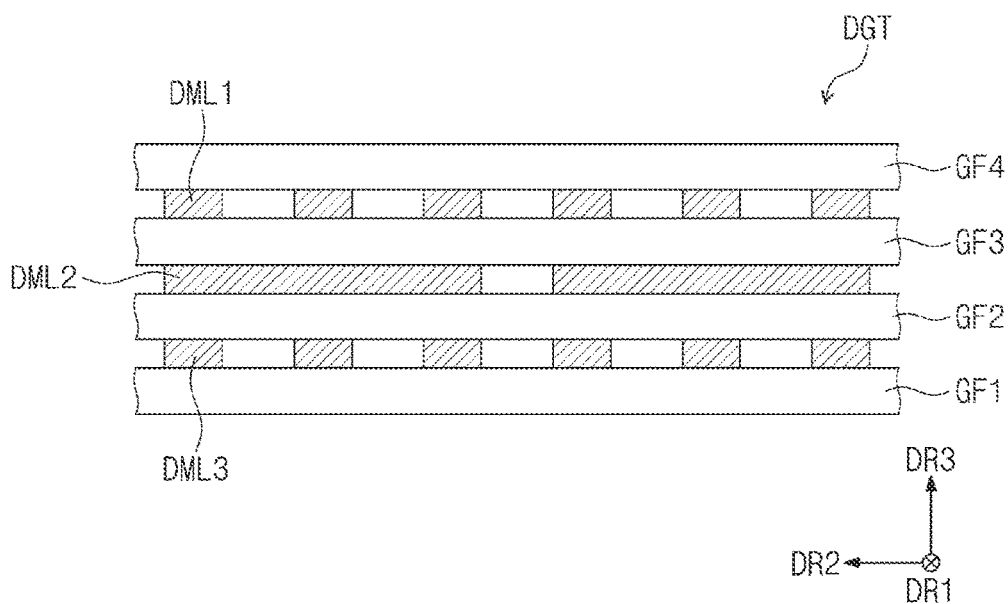
FIG. 23 is a view illustrating a stacked structure of lines illustrated in FIGS. 17, 18, and 19.

FIG. 23 is a view illustrating a stacked structure of the lines illustrated in FIGS. 17, 18, and 19.

In FIG. 23, for convenience of illustration, the first, second, and third dummy lines DML1, DML2, and DML3 are illustrated, and the other lines are omitted.

Referring to FIGS. 17, 18, 19, and 23, the digitizer DGT may include a first support layer GF1, a second support layer GF2, a third support layer GF3, and a fourth support layer GF4 sequentially stacked from bottom to top. The first, second, third, and fourth support layers GF1, GF2, GF3, and GF4 may include, for example, glass fiber reinforced plastic.

The third dummy lines DML3 may be disposed on the first support layer GF1. According to embodiments, the bridge lines BL disposed in the same layer as the third dummy lines DML3 may also be disposed on the first support layer GF1.

The second support layer GF2 may be disposed on the first support layer GF1 and the third dummy lines DML3. The second dummy lines DML2 may be disposed on the second support layer GF2. According to embodiments, the second extending lines EL2 of the second sensing coils CF disposed in the same layer as the second dummy lines DML2 may also be disposed on the second support layer GF2.

The third support layer GF3 may be disposed on the second support layer GF2 and the second dummy lines DML2. The first dummy lines DML1 may be disposed on the third support layer GF3. According to embodiments, the first extending lines EL1 of the first sensing coils RF disposed in the same layer as the first dummy lines DML1 may also be disposed on the third support layer GF3. The fourth support layer GF4 may be disposed on the first dummy lines DML1.

According to embodiments, the digitizer DGT may further include a plurality of insulating layers disposed between the first, second, third, and fourth support layers GF1, GF2, GF3, and GF4 to cover the first, second, and third dummy lines DML1, DML2, and DML3.

Figure 24:
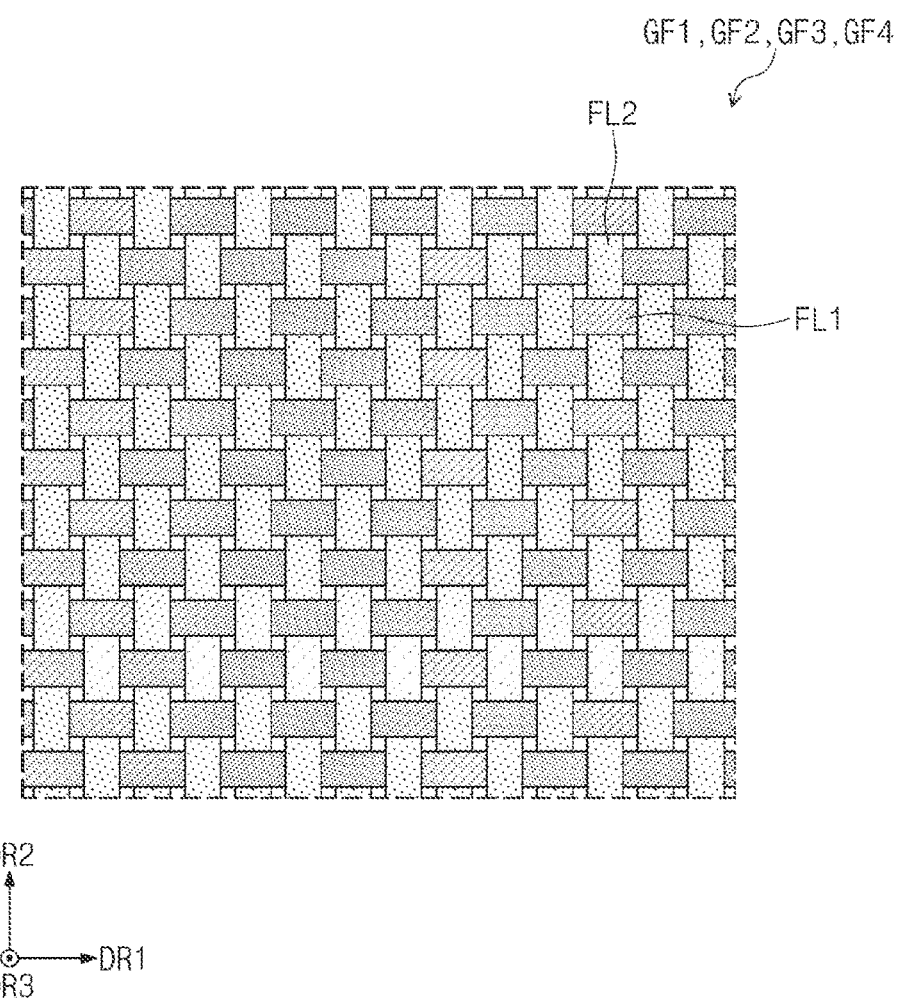
FIG. 24 is a view illustrating a planar configuration of each of first, second, third, and fourth support layers illustrated in FIG. 23.

FIG. 24 is a view illustrating a planar configuration of each of the first, second, third, and fourth support layers illustrated in FIG. 23.

Referring to FIG. 24, the first, second, third, and fourth support layers GF1, GF2, GF3, and GF4 may include fiber lines FL1 and FL2. The fiber lines FL1 and FL2 may be, for example, glass fiber reinforced plastic. The fiber lines FL1 and FL2 may be alternately arranged in the first direction DR1 and the second direction DR2 and may have a fabric shape on the plane.

The modulus of each of the first, second, third, and fourth support layers GF1, GF2, GF3, and GF4 in the first direction DR1 may be about equal to the modulus of each of the first, second, third, and fourth support layers GF1, GF2, GF3, and GF4 in the second direction DR2. The first, second, third, and fourth support layers GF1, GF2, GF3, and GF4 may have the same bending strength when bent in the first direction DR1 or the second direction DR2.

That is, the first, second, third, and fourth support layers GF1, GF2, GF3, and GF4 may have an isotropic modulus. For example, the first, second, third, and fourth support layers GF1, GF2, GF3, and GF4 may have a modulus of about 15 GPa to about 28 GPa in the first direction DR1 and the second direction DR2.

Figure 25:
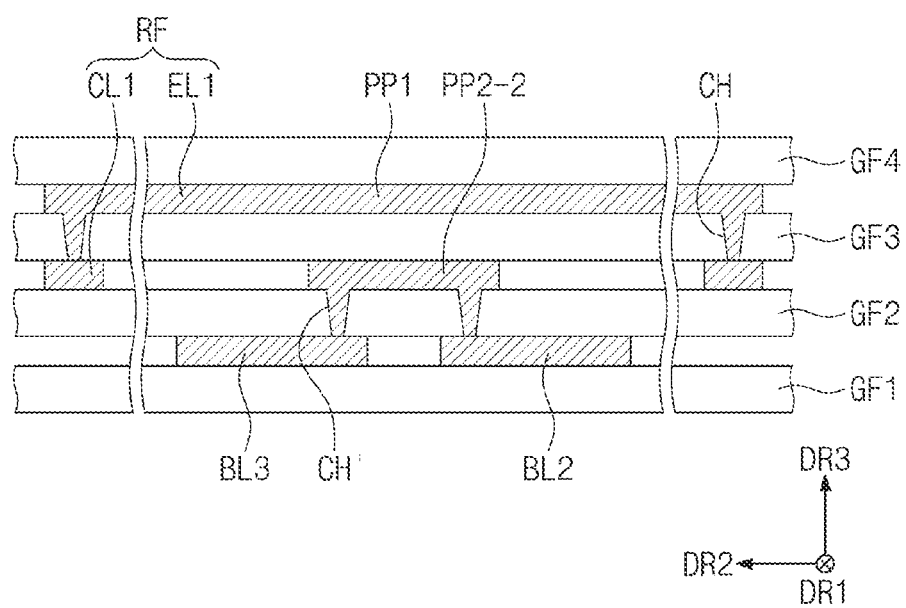
FIG. 25 is a view illustrating a connection configuration of a first extending line and first connecting lines illustrated in FIG. 12 and a connection configuration of a second-second pattern portion and bridge lines illustrated in FIG. 13.

FIG. 25 is a view illustrating a connection configuration of the first extending line and the first connecting lines illustrated in FIG. 12 and a connection configuration of the second-second pattern portion and the bridge lines illustrated in FIG. 13.

In FIG. 25, for convenience of illustration, the first, second, and third dummy lines DML1, DML2, and DML3 are omitted.

Referring to FIG. 25, the second bridge line BL2 and the third bridge line BL3 may be disposed on the first support layer GF1. The second-second pattern portion PP2-2 may be disposed on the second support layer GF2. The second-second pattern portion PP2-2 may be connected to the second bridge line BL2 and the third bridge line BL3 through the contact holes CH' defined in the second support layer GF2.

The first connecting lines CL1 may be disposed on the second support layer GF2. The first extending line EL1 may be disposed on the third support layer GF3. The first extending line EL1 may be connected to the first connecting lines CL1 through the contact holes CH defined in the third support layer GF3.

According to embodiments, the second connector connecting lines CCL disposed in the same layer as the first extending line EL1 may also be disposed on the third support layer GF3. According to embodiments, the second-third lines L2-3 may be connected to the second bridge lines BL2 through contact holes defined in the third support layer GF3 and the second support layer GF2. According to embodiments, connection configurations of the remaining lines illustrated in FIGS. 12 and 13 may be easily derived from FIG. 25.

Figure 26:
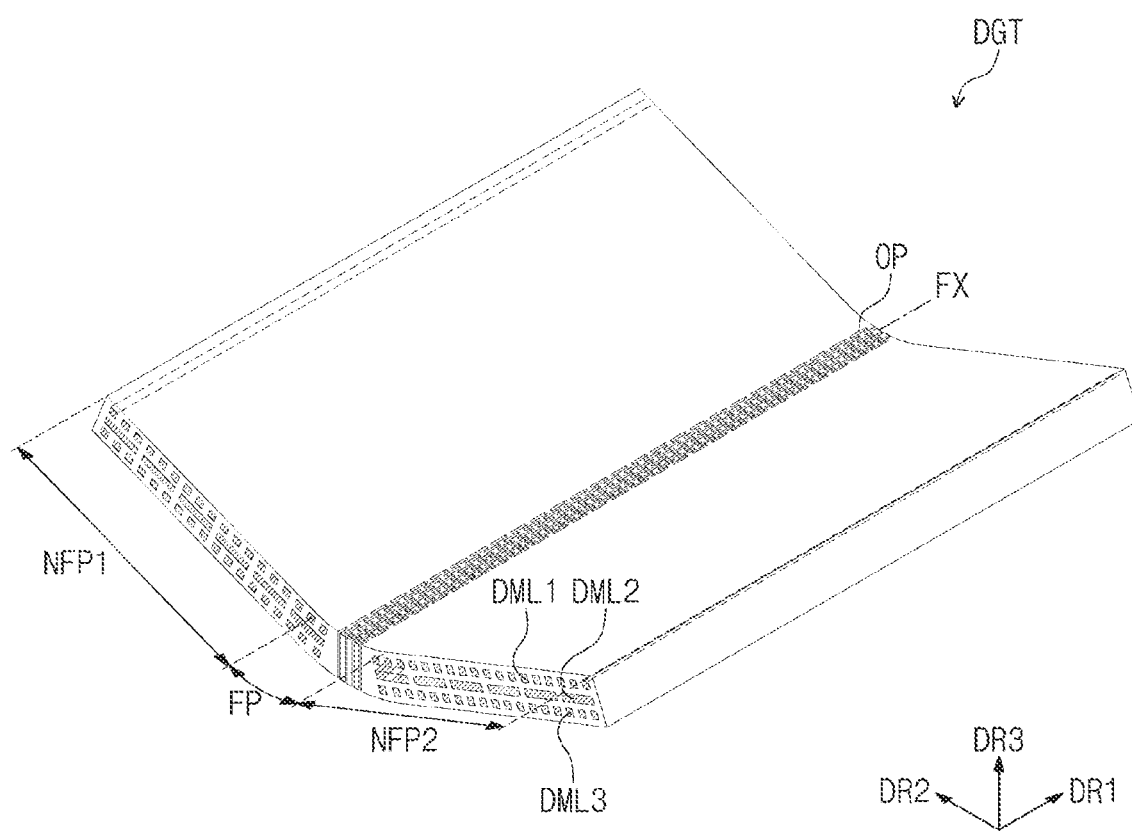
FIG. 26 is a perspective view of the digitizer in which the first, second, and third dummy lines illustrated in FIGS. 17 to 19 are disposed.
Figure 27:
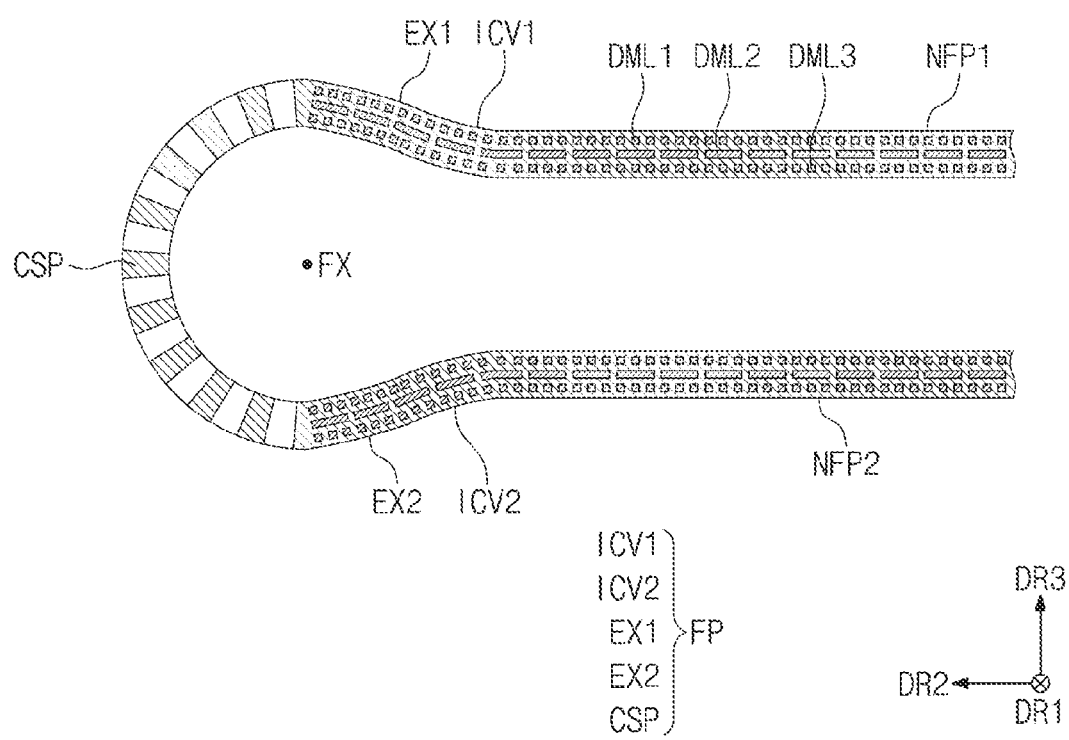
FIG. 27 is a view illustrating a folded state of the digitizer illustrated in FIG. 26.

FIG. 26 is a perspective view of the digitizer in which the first, second, and third dummy lines illustrated in FIGS. 17 to 19 are disposed. FIG. 27 is a view illustrating a folded state of the digitizer illustrated in FIG. 26.

In FIG. 26, some first dummy lines DML1 are illustrated by dotted lines.

Referring to FIGS. 26 and 27, the first and third dummy lines DML1 and DML3 may extend in the first direction DR1 (e.g., may extend lengthwise in the first direction DR1), and the second dummy lines DML2 may extend in the second direction DR2 (e.g., may extend lengthwise in the second direction DR2). The number of first and third dummy lines DML1 and DML3 extending in the first direction DR1 may be larger than the number of second dummy lines DML2 extending in the second direction DR2.

In this case, even though the above-described first, second, third, and fourth support layers GF1, GF2, GF3, and GF4 have the same modulus in the first and second directions DR1 and DR2, the digitizer DGT may have different moduli in the first and second directions DR1 and DR2. When the first, second, and third dummy lines DML1, DML2, and DML3 are disposed, the digitizer DGT may have different moduli in the first and second directions DR1 and DR2. That is, the digitizer DGT may have an anisotropic modulus.

The modulus of the digitizer DGT in the first direction DR1 may be higher than the modulus of the digitizer DGT in the second direction DR2. That is, the bending strength of the digitizer DGT in the first direction DR1 may be higher than the bending strength of the digitizer DGT in the second direction DR2.

Due to the first and third dummy lines DML1 and DML3 extending in the first direction DR1, the modulus of the digitizer DGT in the second direction DR2 may be decreased, and thus, the bending strength of the digitizer DGT in the second direction DR2 may be decreased. Accordingly, the folding portion FP of the digitizer DGT may be easily bent in the second direction DR2 about the folding axis FX extending in the first direction DR1. For example, in an embodiment of the present disclosure, the digitizer DGT may have a modulus of about 20 GPa to about 35 GPa in the second direction DR2.

When all of the first, second, and third dummy lines DML1, DML2, and DML3 extend in the first direction DR1, the bending strength of the digitizer DGT in the second direction DR2 may be further decreased. Accordingly, the folding portion FP of the digitizer DGT may be more easily bent in the second direction DR2 about the folding axis FX extending in the first direction DR1.

Since the folding portion FP is more easily bent, the first and second inverse curvature portions ICV1 and ICV2 may be more easily bent. Since the modulus of the digitizer DGT in the second direction DR2 is decreased, the first and second inverse curvature portions ICV1 and ICV2 may be more easily bent in the second direction DR2.

In an embodiment, grooves may be formed on the first and second inverse curvature portions ICV1 and ICV2 to allow the first and second inverse curvature portions ICV1 and ICV2 to be more easily bent. In this case, a separate process for forming the grooves may be performed.

However, in an embodiment of the present disclosure, at least two types of dummy lines among the first, second, and third dummy lines DML1, DML2, DML2, and DML3 may extend parallel to the folding axis FX in the first direction DR1. Accordingly, the bending strength of the digitizer DGT in the second direction DR2 may be decreased, and thus, the first and second inverse curvature portions ICV1 and ICV2 may be easily bent without forming the grooves.

The first, second, and third dummy lines DML1, DML2, DML2, and DML3 may include metal. Accordingly, the first, second, and third dummy lines DML1, DML2, DML2, and DML3 may perform a heat radiating function. In this case, according to embodiments, the display device DD does not include a separate heat radiating layer for performing a heat radiating function. Accordingly, the thickness of the display device DD may be decreased.

FIGS. 28 to 31 are views illustrating sequential layer configurations of the digitizer illustrated in FIGS. 12 and 13, according to an embodiment of the present disclosure.

As illustrated in FIGS. 17 to 19, the digitizer DGT may be constituted by the three layers LY1, LY2, and LY3. However, without being limited thereto, as illustrated in FIGS. 28 to 31, the digitizer DGT may be constituted by four layers LY1, LY2, LY3, and LY4. The following description will be focused on the difference between the components illustrated in FIGS. 17 to 19 and the components illustrated in FIGS. 28 to 31, and thus, a further description of components and technical aspects previously described may be omitted.

Referring to FIGS. 28 to 31, the digitizer DGT may include the first, second, third, and fourth layers LY1, LY2, LY3, and LY4. The lines illustrated in FIGS. 12 and 13 may be disposed in the first, second, third, and fourth layers LY1, LY2, LY3, and LY4.

Figure 28:
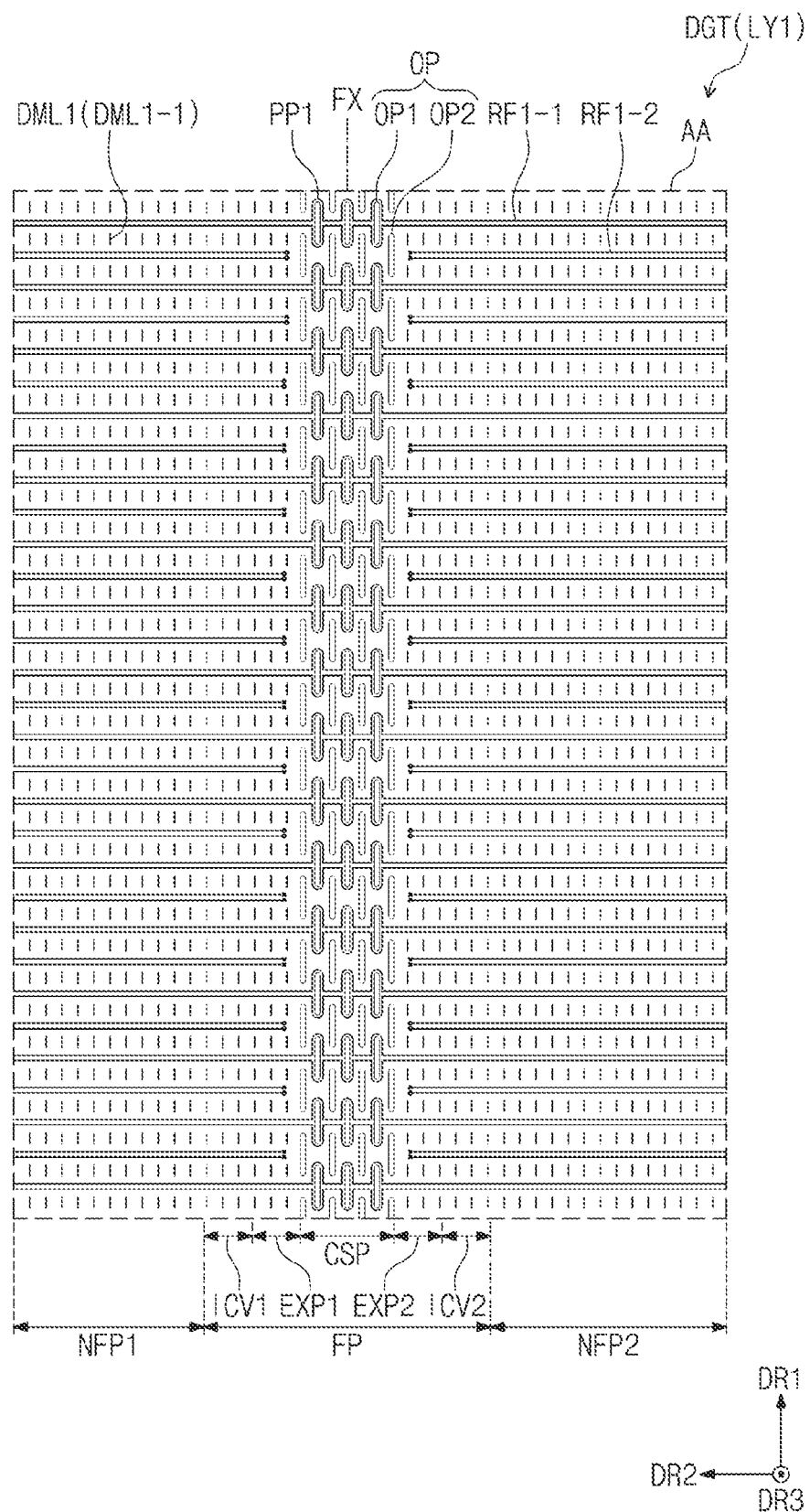
FIGS. 28 to 31 are views illustrating sequential layer configurations of the digitizer illustrated in FIGS. 12 and 13, according to an embodiment of the present disclosure.

Referring to FIG. 28, the first sensing coil RF may include first-first sensing coils RF1-1 disposed in the first layer LY1 and first-second sensing coils RF1-2 disposed in the first layer LY1. In the active region AA, the first-first sensing coils RF1-1 may extend in the second direction DR2 (e.g., extend lengthwise in the second direction DR2) and may curvedly extend along the peripheries of the first openings OP1.

In the active region AA, the first-second sensing coils RF1-2 may be disposed in the same layer as the first-first sensing coils RF1-1. In the active region AA, the first-second sensing coils RF1-2 may be spaced apart from the first-first sensing coils RF1-1 and may extend in the second direction DR2 (e.g., extend lengthwise in the second direction DR2). The first-second sensing coils RF1-2 may be disposed in the first and second non-folding portions NFP1 and NFP2. The first-second sensing coils RF1-2 may be disposed in the first and second inverse curvature portions ICV1 and ICV2 and the first and second extensions EXP1 and EXP2.

In an embodiment, the first-second sensing coils RF1-2 do not extend along the peripheries of the second openings OP2. In an embodiment, the first-second sensing coils RF1-2 are not disposed in the curved surface portion CSP. The first-second sensing coils RF1-2 may be divided by the curved surface portion CSP and may be disposed in the first and second non-folding portions NFP1 and NFP2.

Unlike in FIG. 17, in an embodiment according to FIG. 28, the second connector connecting lines CCL2 are not disposed in the first layer LY1.

The first dummy lines DML1 may include a plurality of first-first dummy lines DML1-1 disposed in the first layer LY1. The first dummy lines DML1 may be disposed in the same layer as the first-first sensing coils RF1-1 and the first-second sensing coils RF1-2. The first-first dummy lines DML1-1 may extend in the first direction DR1 (e.g., extend lengthwise in the first direction DR1) and may be arranged in the second direction DR2.

The first-first dummy lines DML1-1 may be disposed in the first and second non-folding portions NFP1 and NFP2 and the first and second inverse curvature portions ICV1 and ICV2. The first-first dummy lines DML1-1 may be disposed between the first-first sensing coils RF1-1 and first-second sensing coils RF1-2.

Figure 29:
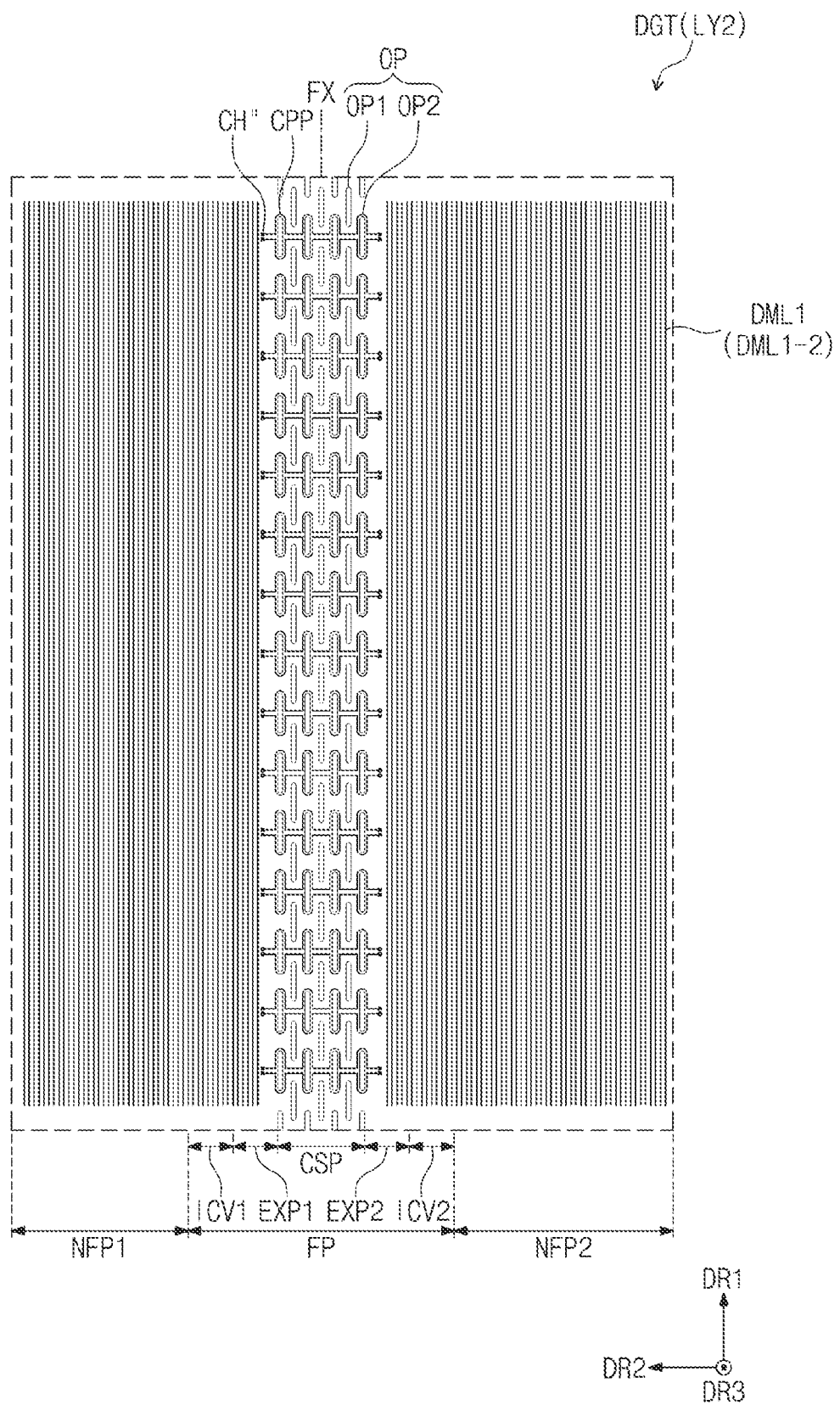

Referring to FIGS. 28 and 29, the first sensing coil RF may include connecting pattern portions CPP disposed in the second layer LY2. The connecting pattern portions CPP may curvedly extend along the peripheries of the second openings OP2.

Among the first pattern portions PP1 illustrated in FIG. 17, the first pattern portions PP1 disposed along the peripheries of the first openings OP1 may be disposed in the first layer LY1 in FIG. 28. Furthermore, among the first pattern portions PP1 illustrated in FIG. 17, the first pattern portions PP1 disposed along the peripheries of the second openings OP2 may be defined as the connecting pattern portions CPP and may be disposed in the second layer LY2 in FIG. 29. The connecting pattern portions CPP may be connected to the first-second sensing coils RF1-2 through contact holes CH".

The first dummy lines DML1 may include a plurality of first-second dummy lines DML1-2 disposed in the second layer LY2. The first-second dummy lines DML1-2 may be disposed around the connecting pattern portions CPP. The first-second dummy lines DML1-2 may be disposed in the first and second non-folding portions NFP1 and NFP2 and the first and second inverse curvature portions ICV1 and ICV2. The first-second dummy lines DML1-2 may extend in the first direction DR1 (e.g., extend lengthwise in the first direction DR1) and may be arranged in the second direction DR2.

Figure 30:
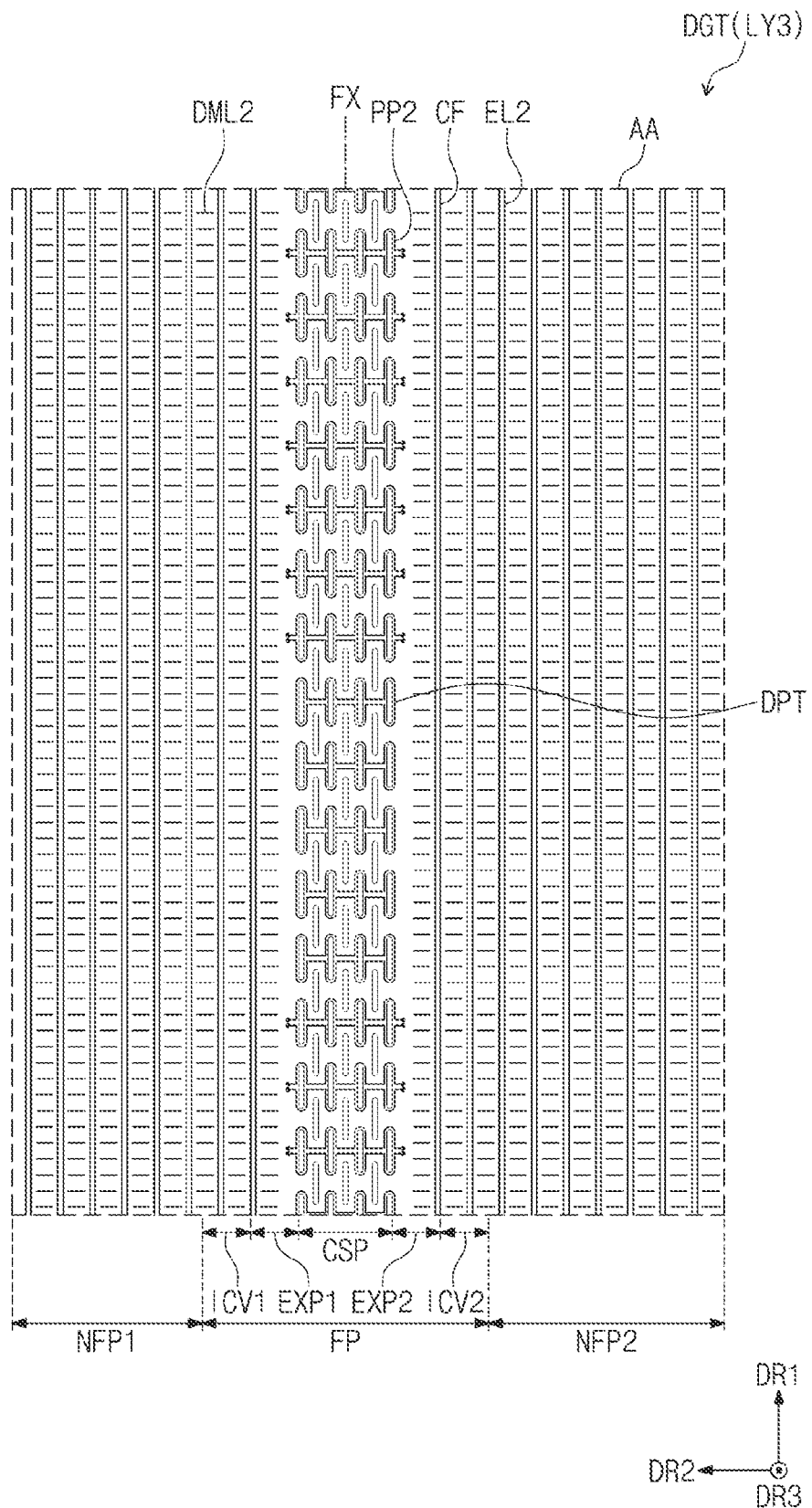

Referring to FIG. 30, the second sensing coils CF, the second pattern portions PP2, and the dummy pattern portions DPT may be disposed in the third layer LY3. Furthermore, the second dummy lines DML2 may be disposed in the third layer LY3. The second dummy lines DML2 may extend in the second direction DR2 (e.g., extend lengthwise in the second direction DR2) and may be arranged in the first direction DR1. The second dummy lines DML2 may be disposed between the second sensing coils CF. The configuration of the second dummy lines DML2 may be substantially the same as the configuration illustrated in FIG. 18.

Figure 31:
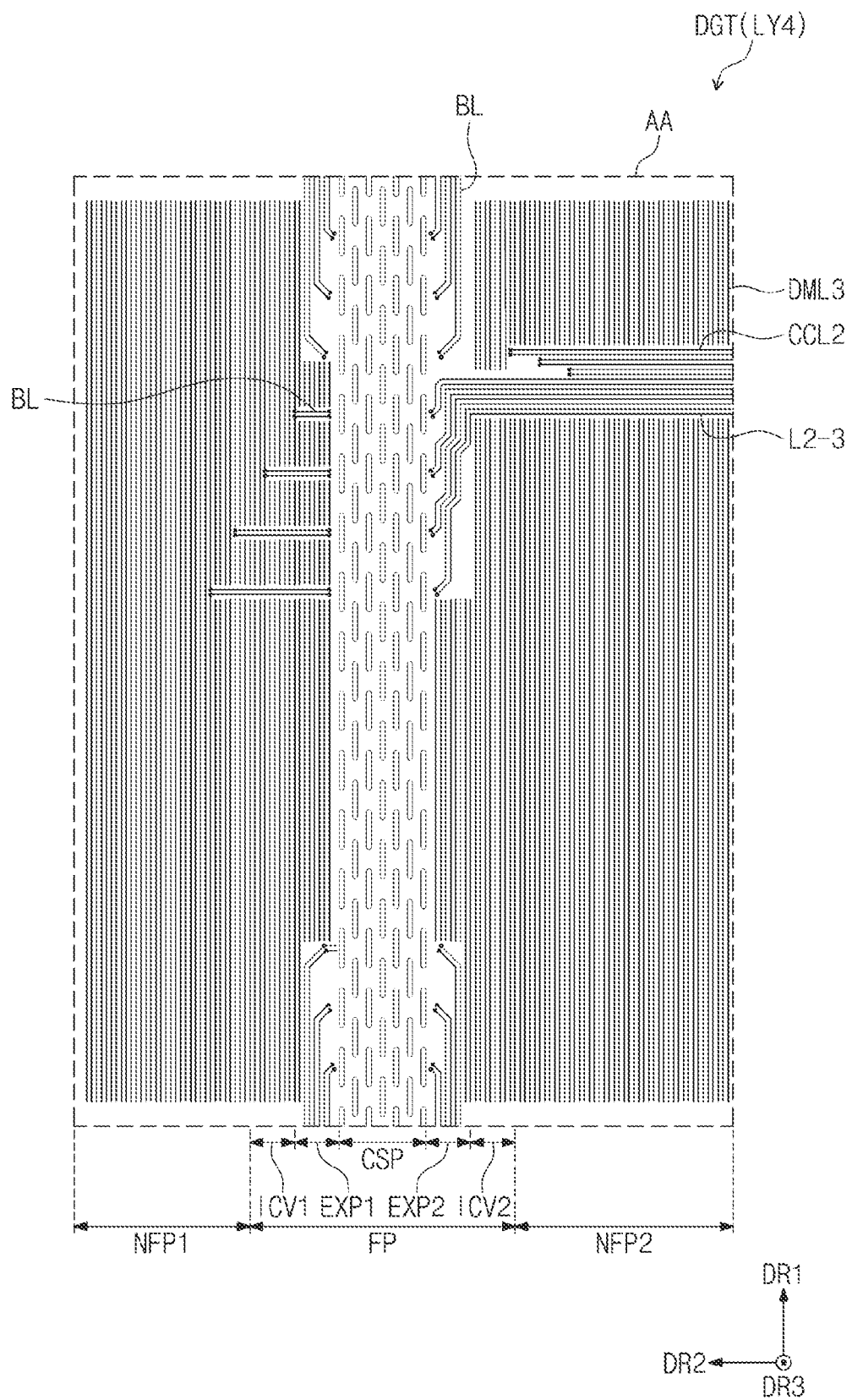

Referring to FIG. 31, the bridge lines BL and the second connector connecting lines CCL2 may be disposed in the fourth layer LY4. The second bridge lines BL2 may extend from the second-third lines L2-3 of the second connector connecting lines CCL2.

The third dummy lines DML3 may be disposed in the fourth layer LY4. The third dummy lines DML3 may extend in the first direction DR1 (e.g., extend lengthwise in the first direction DR1) and may be arranged in the second direction DR2. The third dummy lines DML3 may be disposed around the bridge lines BL, between the bridge lines BL, and around the second connector connecting lines CCL2.

Referring to FIGS. 28 and 31, the first-first dummy lines DML1-1, the first-second dummy lines DML1-2, and the third dummy lines DML3 may extend in the first direction DR1 (e.g., extend lengthwise in the first direction DR1), and the second dummy lines DML2 may extend in the second direction DR2 (e.g., extend lengthwise in the second direction DR2).

Figure 32:
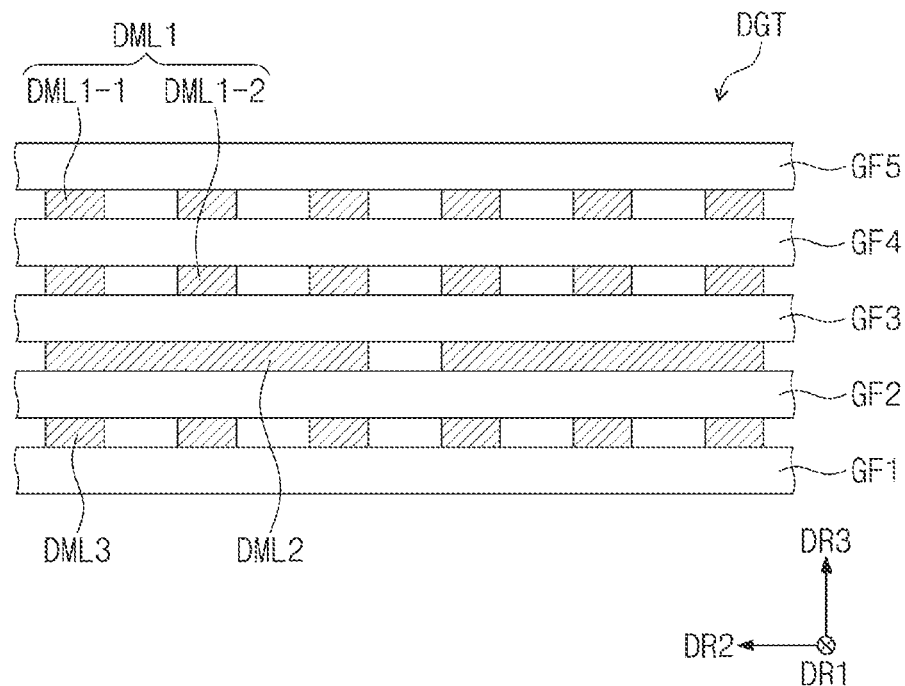
FIG. 32 is a view illustrating a stacked structure of lines illustrated in FIGS. 28 to 31.

FIG. 32 is a view illustrating a stacked structure of the lines illustrated in FIGS. 28 to 31.

In FIG. 32, for convenience of illustration, the first-first dummy lines DML1-1, the first-second dummy lines DML1-2, the second dummy lines DML2, and the third dummy lines DML3 are illustrated, and the other lines are omitted.

Referring to FIGS. 28 to 32, the digitizer DGT may include first, second, third, fourth, and fifth support layers GF1, GF2, GF3, GF4, and GF5 sequentially stacked from bottom to top. The first, second, third, fourth, and fifth support layers GF1, GF2, GF3, GF4, and GF5 may include, for example, glass fiber reinforced plastic.

The dummy lines DML3 may be disposed on the first support layer GF1, and the second dummy lines DML2 may be disposed on the second support layer GF2. The first-second dummy lines DML1-2 may be disposed on the third support layer GF3, and the first-first dummy lines DML1-1 may be disposed on the fourth support layer GF4. The fifth support layer GF5 may be disposed on the fourth support layer GF4 and the first-first dummy lines DML1-1.

Figure 33:
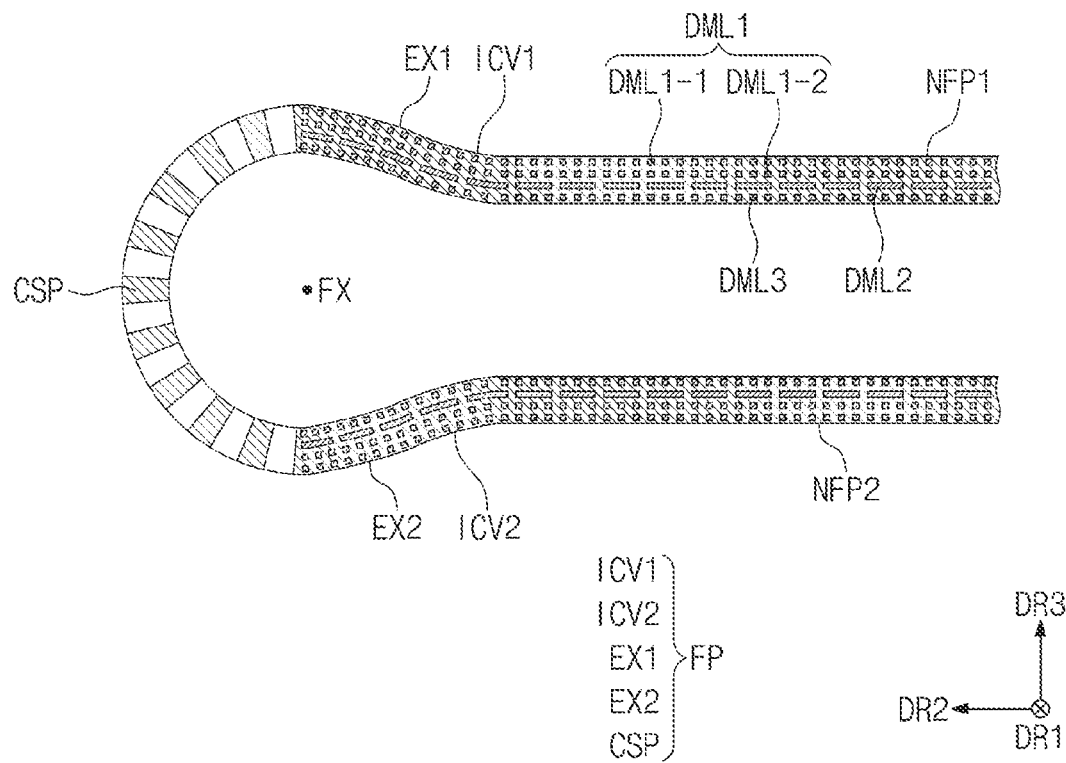
FIG. 33 is a view illustrating a folded state of the digitizer illustrated in FIG. 32.

FIG. 33 is a view illustrating a folded state of the digitizer illustrated in FIG. 32.

Referring to FIG. 33, the first-first dummy lines DML1-1, the first-second dummy lines DML1-2, and the third dummy lines DML3 may extend in the first direction DR1 (e.g., extend lengthwise in the first direction DR1), and the second dummy lines DML2 may extend in the second direction DR2 (e.g., extend lengthwise in the second direction DR2). The number of first-first dummy lines DML1-1, the first-second dummy lines DML1-2, and the third dummy lines DML3 extending in the first direction DR1 may be larger than the number of second dummy lines DML2 extending in the second direction DR2.

Due to the first-first dummy lines DML1-1, the first-second dummy lines DML1-2, and the third dummy lines DML3 extending in the first direction DR1, the modulus of the digitizer DGT in the second direction DR2 may be decreased, and thus, the bending strength of the digitizer DGT in the second direction DR2 may be decreased. Accordingly, the folding portion FP may be easily bent in the second direction DR2 about the folding axis FX parallel to the first direction DR1. The first and second inverse curvature portions ICV1 and ICV2 may be more easily bent in the second direction DR2.

Figure 34:
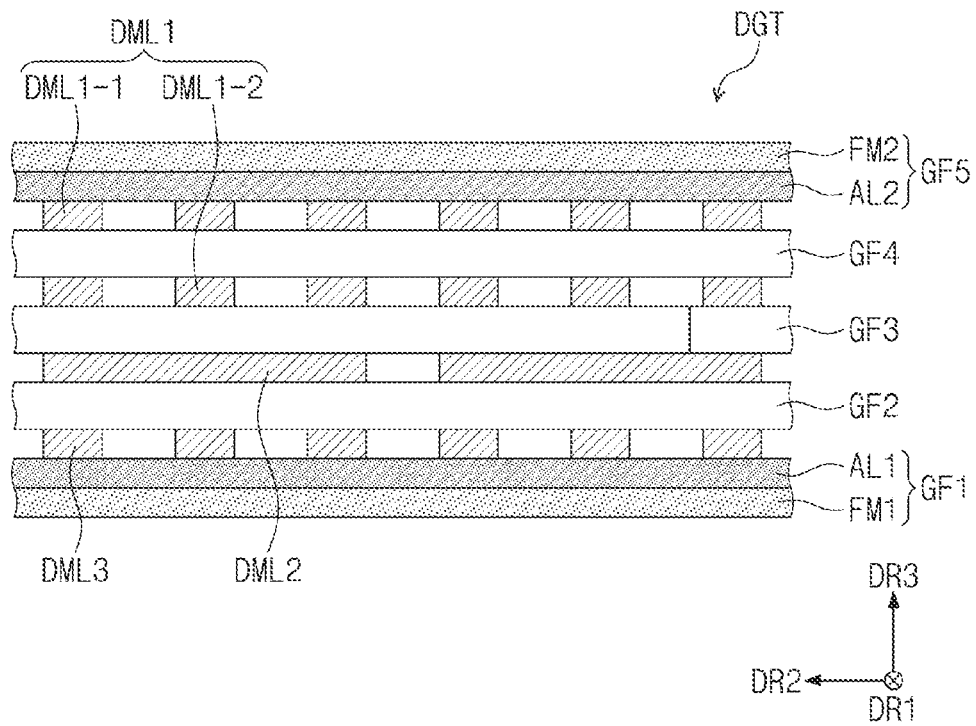
FIGS. 34 and 35 are views illustrating stacked structures of lines illustrated in FIGS. 28 to 31, according to embodiments of the present disclosure.
Figure 35:
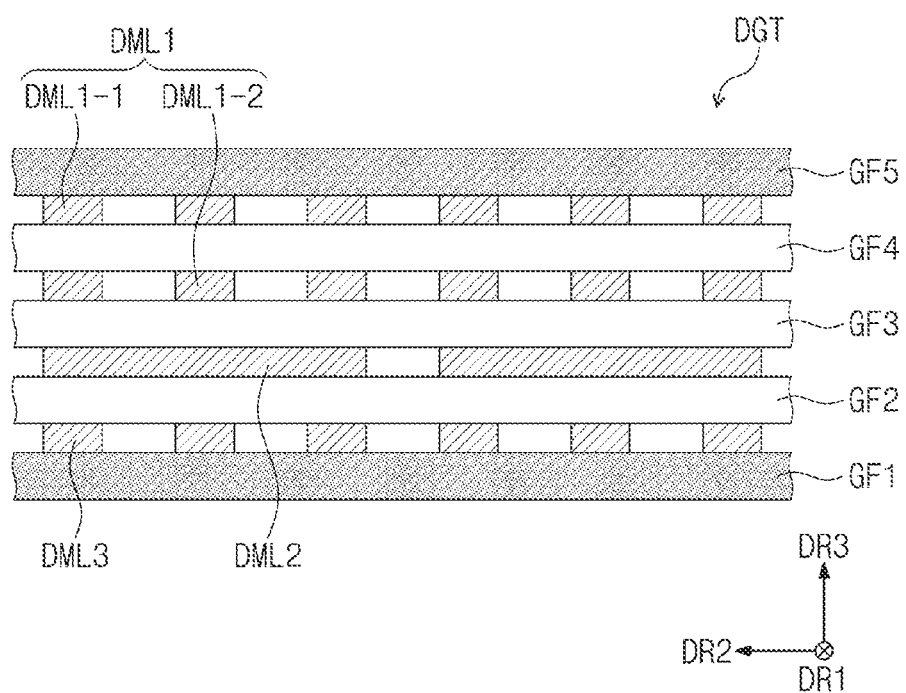

FIGS. 34 and 35 are views illustrating stacked structures of the lines illustrated in FIGS. 28 to 31, according to embodiments of the present disclosure.

The following description will be focused on the difference between the components illustrated in FIG. 32 and the components illustrated in FIGS. 34 and 35, and thus, a further description of components and technical aspects previously described may be omitted.

Referring to FIG. 34, the first support layer GF1 may include a first support film FM1 and a first adhesive layer AL1. The fifth support layer GF5 may include a second support film FM2 and a second adhesive layer AL2.

The dummy lines DML3 may be disposed on the first support film FM1. The first adhesive layer AL1 may be disposed between the third dummy lines DML3 and the first support film FM1. The third dummy lines DML3 may be attached to the first support film FM1 by the first adhesive layer AL1.

The second support film FM2 may be disposed on the support layer GF4. The second support film FM2 may be disposed on the first-first dummy lines DML1-1. The second adhesive layer AL2 may be disposed between the second support film FM2 and the first-first dummy lines DML1-1. The second support film FM2 may be attached to the first-first dummy lines DML1-1 by the second adhesive layer AL2.

The first and second support films FM1 and FM2 may include, for example, polyimide, and the first and second adhesive layers AL1 and AL2 may include, for example, a pressure sensitive adhesive.

Referring to FIG. 35, the first support layer GF1 and the fifth support layer GF5 may include a material different from those of the second to fourth support layers GF2 to GF4. For example, the first support layer GF1 and the fifth support layer GF5 may include photo sensitive resist (PSR). The first support layer GF1 and the fifth support layer GF5 may be coating layers.

According to the embodiments of the present disclosure, dummy lines disposed in at least two layers may be arranged in a direction parallel to the folding axis, and thus, the digitizer serving as a support part may be more easily folded in a dumbbell shape.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:
1. A display device, comprising:
   a display panel comprising a first non-folding region, a second non-folding region, and a folding region disposed between the first and second non-folding regions, wherein the folding region is foldable about a folding axis; and
   a digitizer disposed under the display panel and divided into an active region and a non-active region around the active region,
   wherein the digitizer comprises:
   a first sensing coil disposed in a first layer in the active region;
   a first dummy line disposed in the first layer with the first sensing coil;
   a second sensing coil disposed in a second layer below the first sensing coil in the active region;
   a second dummy line disposed in the second layer with the second sensing coil;
   a bridge line disposed in a third layer below the second sensing coil; and
   a third dummy line disposed in the third layer with the bridge line, and
   wherein at least two dummy lines among the first, second, and third dummy lines extend lengthwise in a same direction parallel to the folding axis.
2. The display device of claim 1, wherein the first and third dummy lines extend in the same direction, and the second dummy line extends in a direction different from the direction in which the first and third dummy lines extend.

3. The display device of claim 1, wherein the first, second, and third dummy lines extend in the same direction.

4. The display device of claim 1, wherein the first, second, and third dummy lines are separated from the first and second sensing coils and the bridge line, and are in a floating state.

5. The display device of claim 1, wherein each of the first, second, and third dummy lines, each of the first and second sensing coils, and the bridge line are provided as a plurality, and
wherein the plurality of first dummy lines are disposed between the plurality of first sensing coils, and the plurality of second dummy lines are disposed between the plurality of second sensing coils.

6. The display device of claim 5, wherein some first dummy lines of the plurality of first dummy lines are connected to each other, and some second dummy lines of the plurality of second dummy lines are connected to each other.

7. The display device of claim 5, wherein among the plurality of bridge lines, a pair of bridge lines is connected to a corresponding second sensing coil among the plurality of second sensing coils and forms a loop shape with the corresponding second sensing coil.

8. The display device of claim 1, wherein the folding axis is parallel to a first direction, and the first non-folding region, the folding region, and the second non-folding region are arranged in a second direction crossing the first direction.

9. The display device of claim 8, wherein the first and third dummy lines extend in the first direction, and the second dummy line extends in the second direction.

10. The display device of claim 8, wherein the first, second, and third dummy lines extend in the first direction.

11. The display device of claim 8, wherein the first sensing coil comprises:
a first-first sensing coil disposed in the first layer;
a plurality of first-second sensing coils disposed in the first layer with the first-first sensing coil and spaced apart from the first-first sensing coil, the first-second sensing coils being disposed in the first and second non-folding regions, respectively; and
a connecting pattern portion disposed below the first-first sensing coil and the first-second sensing coils and overlapping the folding region, and connecting the first-second sensing coils disposed in the first and second non-folding regions, and
wherein the first dummy line comprises:
a first-first dummy line disposed in the first layer with the first-first sensing coil and the first-second sensing coils; and
a first-second dummy line disposed in the second layer with the connecting pattern portion.

12. The display device of claim 11, wherein the first-first dummy line, the first-second dummy line, and the third dummy line extend in the first direction, and the second dummy line extends in the second direction.

13. The display device of claim 8, further comprising:
a first support layer, a second support layer, a third support layer, and a fourth support layer sequentially stacked from bottom to top,
wherein the bridge line and the third dummy line are disposed on the first support layer, the second sensing coil and the second dummy line are disposed on the second support layer, the first sensing coil and the first dummy line are disposed on the third support layer, and the fourth support layer is disposed on the first sensing coil and the first dummy line.

14. The display device of claim 13, wherein the first, second, third, and fourth support layers comprise a glass fiber reinforced plastic.

15. The display device of claim 8, wherein a plurality of openings are defined in a folding portion of the digitizer overlapping the folding region when viewed on a plane, and
wherein the openings are arranged in the first direction and the second direction, openings disposed in an $h^{th}$ column and openings disposed in an $(h+1)^{th}$ column among the openings are staggered with respect to each other, the columns correspond to the first direction, and h is a positive integer.

16. The display device of claim 15, wherein the first sensing coil comprises:
a plurality of first extending lines disposed in the active region and extending parallel to each other in the second direction between the openings; and
a plurality of first connecting lines disposed in the non-active region and extending in the first direction, the first connecting lines being connected to opposite ends of the first extending lines, and
wherein the second sensing coil comprises:
a plurality of second extending lines disposed in the active region and extending parallel to each other in the first direction; and
a plurality of second connecting lines disposed in the non-active region and extending in the second direction, the second connecting lines being connected to opposite ends of the second extending lines.

17. The display device of claim 16, wherein each of the first extending lines comprises:
a plurality of first extensions disposed in first and second non-folding portions of the digitizer overlapping the first and second non-folding regions, respectively; and
a first pattern portion disposed in the folding portion, and
wherein the first pattern portion extends from the first extensions, and each of the first extensions has a greater width than a width of the first pattern portion.

18. The display device of claim 16, wherein the first extending lines extend along upper and lower peripheries of first openings arranged in a $k^{th}$ row among the openings and upper and lower peripheries of second openings arranged in a $(k+1)^{th}$ row,
wherein the rows extend in the second direction, and k is a positive integer.

19. The display device of claim 18, wherein the second sensing coil further comprises:
a plurality of second pattern portions extending along the upper and lower peripheries of the second openings without extending along the upper and lower peripheries of the first openings,
wherein the second extending lines comprise:
a second-first extending line extending in the first direction and connected to first ends of the second connecting lines; and
a second-second extending line and a second-third extending line connected to second ends of the second connecting lines, respectively,
wherein the second-second extending line and the second-third extending line are connected to the second pattern portions, respectively, and
wherein the bridge line is provided as a plurality, and the second pattern portions are connected to the plurality of bridge lines.

20. The display device of claim 15, wherein the folding portion comprises:

a curved surface portion having the openings defined therein; and first and second inverse curvature portions disposed between the curved surface portion and first and second non-folding portions of the digitizer overlapping the first and second non-folding regions, respectively, and wherein the openings are not defined in the first and second inverse curvature portions, and when viewed on the plane, the first, second, and third dummy lines overlap the first and second inverse curvature portions and the first and second non-folding regions without overlapping the curved surface portion.

21. A digitizer, comprising:

a first sensing coil disposed in a first layer;

a first-first dummy line disposed in the first layer with the first sensing coil;

a connecting pattern portion disposed in a second layer below the first sensing coil;

a first-second dummy line disposed in the second layer with the connecting pattern portion;

a second sensing coil disposed in a third layer below the connecting pattern portion;

a second dummy line disposed in the third layer with the second sensing coil;

a bridge line disposed in a fourth layer below the second sensing coil; and a third dummy line disposed in the fourth layer with the bridge line, wherein the first-first dummy line, the first-second dummy line, and the third dummy line extend in a same direction, and the second dummy line extends in a direction different from the direction in which the first-first dummy line, the first-second dummy line, and the third dummy line extend.

22. A display device, comprising:

a display panel comprising a folding region, the folding region being foldable about a folding axis parallel to a first direction; and a digitizer disposed under the display panel and divided into an active region and a non-active region around the active region, wherein the digitizer comprises:

a plurality of first sensing coils disposed in a first layer in the active region and extending in a second direction crossing the first direction;

a plurality of first dummy lines disposed in the first layer with the first sensing coils and disposed between the first sensing coils;

a plurality of second sensing coils disposed in a second layer below the first sensing coils in the active region and extending in the second direction;

a plurality of second dummy lines disposed in the second layer with the second sensing coils and disposed between the second sensing coils;

a plurality of bridge lines disposed in a third layer below the second sensing coils; and a plurality of third dummy lines disposed in the third layer with the bridge lines, and wherein the first and third dummy lines extend lengthwise in the first direction parallel to the folding axis, and the second dummy lines extend lengthwise in the second direction.

* * * * *